(12) United States Patent
Fenigstein

(10) Patent No.: US 9,935,618 B1
(45) Date of Patent: Apr. 3, 2018

(54) SCHMITT TRIGGER CIRCUIT WITH HYSTERESIS DETERMINED BY MODIFIED POLYSILICON GATE DOPANTS

(71) Applicant: Tower Semiconductor Ltd., Midgal Haemek (IL)

(72) Inventor: Amos Fenigstein, Haifa (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 15/282,397

(22) Filed: Sep. 30, 2016

(51) Int. Cl.
| | |
|---|---|
| *H03K 3/35* | (2006.01) |
| *H03K 3/3565* | (2006.01) |
| *H03K 3/012* | (2006.01) |
| *H04N 5/355* | (2011.01) |
| *H04N 5/3745* | (2011.01) |

(52) U.S. Cl.
CPC ........ *H03K 3/3565* (2013.01); *H03K 3/012* (2013.01); *H04N 5/355* (2013.01); *H04N 5/3745* (2013.01)

(58) Field of Classification Search
CPC .............................. H03K 3/3565; H03K 3/012
USPC .................................................. 327/205, 206
See application file for complete search history.

(56) References Cited

U.S. PATENT DOCUMENTS

| | | | | |
|---|---|---|---|---|
| 5,851,922 A | * | 12/1998 | Bevk ................ | H01L 21/82383 257/755 |
| 6,433,602 B1 | * | 8/2002 | Lall ..................... | H03K 3/3565 327/205 |

OTHER PUBLICATIONS

Kader et al. "Advancement of CMOS Schmitt Trigger Circuits" Modern Applied Science vol. 6, No. 12, Nov. 2012, pp. 51-58.
Koppa et al. "A 105.6dB DR and 65dB Peak SNR Self-Reset CMOS Image Sensor Using a Schmitt Trigger Circuit" IEEE 2011.

* cited by examiner

*Primary Examiner* — John Poos
(74) *Attorney, Agent, or Firm* — Bever, Hoffman & Harms, LLP

(57) ABSTRACT

A Schmitt trigger's hysteresis is established by standard and non-standard MOSFETs having different (lower/higher) threshold voltages. For example, a standard n-channel transistor having a relatively low threshold voltage (e.g., 1V) sets the lower trigger switching voltage, and a non-standard n-channel transistor (e.g., an n-channel source/drain and a polysilicon gate doped with a p-type dopant) exhibits a relatively high threshold voltage (e.g., 2V) that sets the higher trigger switching voltage. An output control circuit generates the Schmitt trigger's digital output signal based on the on/off states of the two (non-standard and standard) MOSFETs, whereby the changes digital output signal between two values when the analog input signal falls below the lower threshold voltage (i.e., when both MOSFETs are turned on/off) and rises above the higher threshold voltage (i.e., when both MOSFETs are turned off/on). Self-resetting and other circuits utilize the Schmitt trigger to facilitate, e.g., high dynamic range image sensor pixels.

22 Claims, 12 Drawing Sheets

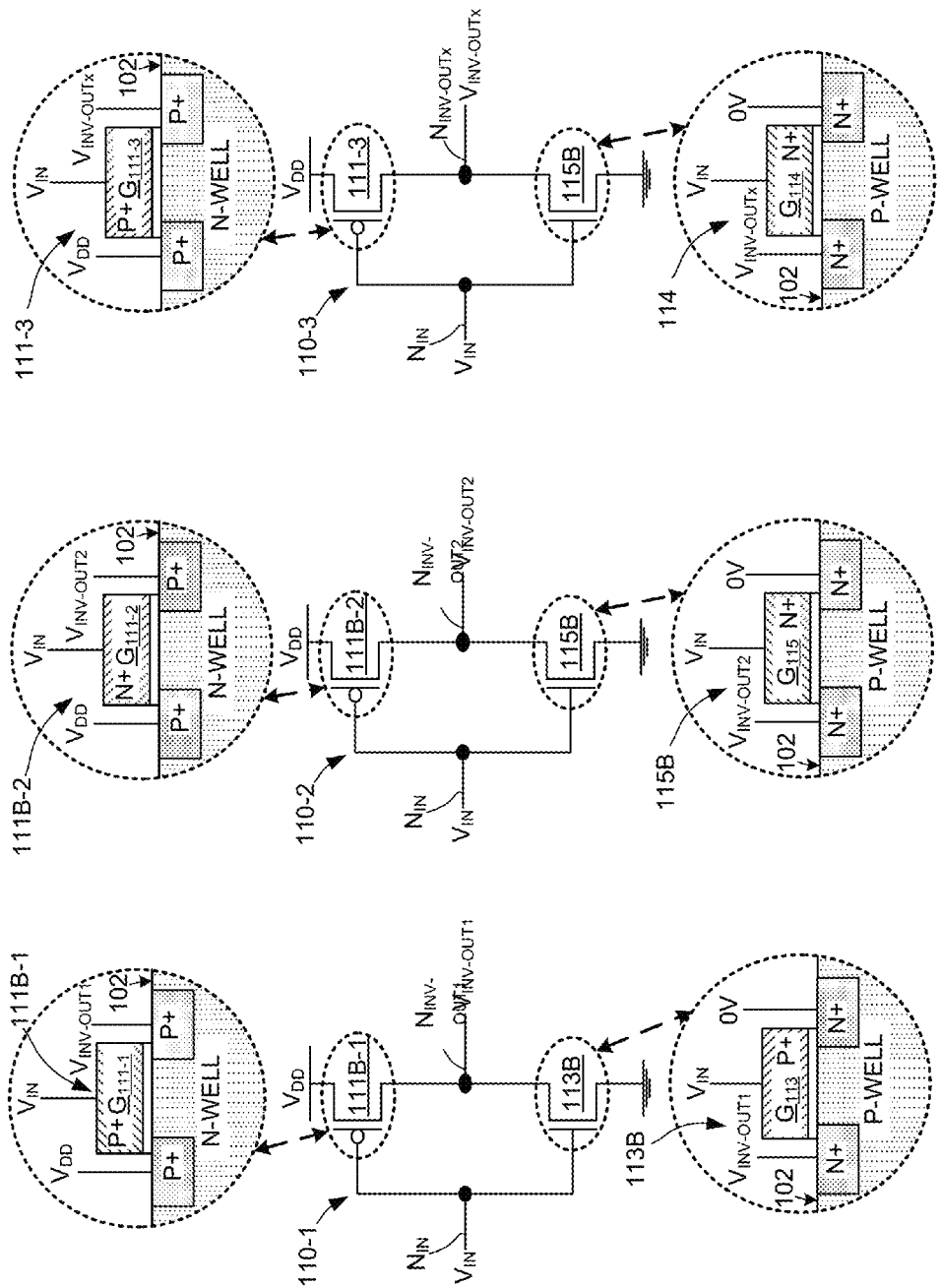

SCHMITT TRIGGER CIRCUIT WITH HYSTERESIS DETERMINED BY MODIFIED POLYSILICON GATE DOPANTS

FIELD OF THE INVENTION

This invention relates to integrated circuit (IC) devices that utilize Schmitt trigger circuits, more particularly to IC devices (e.g., advanced image or radiation sensors) that utilize a large number of Schmitt trigger circuits.

BACKGROUND OF THE INVENTION

Schmitt triggers are commonly utilized in ICs to convert analog input signals to a digital output signals, where each Schmitt trigger generates a first (e.g., relatively high voltage) digital output signal value when a received analog input signal's voltage exceeds a higher trigger switching voltage value, and switches to a low output signal value when the analog input signal's voltage drops to (falls below) a lower trigger voltage value. Each Schmitt trigger has an associated hysteresis defined by the particular high and low trigger voltage values at which the Schmitt trigger switches between high and low output values (or low and high output values, depending on the Schmitt trigger's configuration). A problem with conventional (e.g., six-transistor) Schmitt trigger circuits is that the higher/lower switching voltage values can vary due to fabrication process variations, whereby conventional Schmitt triggers exhibit unreliable (inaccurate) hysteresis characteristics. When accurate hysteresis is required, conventional Schmitt triggers are typically enhanced by applying positive feedback to the noninverting input of a comparator or differential amplifier, whereby the hysteresis is defined by two predetermined trigger values that are determined by a reference voltage value supplied to the comparator or differential amplifier. For example, in a non-inverting Schmitt trigger configuration, the output signal value is high voltage level (e.g., 3.3V) whenever an applied analog input signal is higher than the Schmitt trigger's higher trigger voltage (e.g., 2V), and the output signal value remains high until the input signal subsequently falls below the trigger's lower trigger voltage (e.g., 2V), at which point the output signal value switches to a low voltage level (e.g., 0V). In contrast, an inverting Schmitt trigger (or Schmitt trigger circuit) generates a low output signal value whenever the input rises above the higher trigger voltage value, and generates a high output whenever the input falls below the lower trigger voltage value.

Many advanced image or radiation sensors are integrated circuits (ICs) including pixels formed by semiconductor processing (e.g., Complimentary metal-oxide-semiconductor (CMOS)) techniques, with each pixel including a sensing element, a self-reset circuit and an analog counter. For example, in high dynamic range (HDR) image sensors, each pixel utilizes a self-reset circuit to reset a photodiode to a maximum charge value each time the photodiode is saturated (i.e., each time the photodiode's stored charge falls below a predetermined minimum charge value), and utilizes an analog counter to determine the amount of received light (pixel response) by counting the number of times the photodiode is saturated and reset during a predefined exposure period. Schmitt-trigger circuits are often used to implement the self-reset circuit in such HDR image sensors, and are also utilized in conjunction with analog counters in a similar manner in Geiger mode single-photon avalanche diodes (SPADs). In both instances, the trend toward advance sensor IC devices including larger arrays (i.e., hundreds of thousands or millions of pixels) increases the need for self-reset circuits and analog counters that are small and exhibit low power consumption.

Conventional Schmitt triggers present an obstacle to developing smaller pixels and larger pixel counts in advanced sensor IC devices. For example, because a Schmitt trigger is utilized in the self-reset circuit of each pixel in order to determine the amount of received light during each exposure period, every Schmitt trigger utilized on an advanced image sensor is necessarily required to exhibit accurate and uniform (i.e., substantially identical) hysteresis characteristics in order for the advanced image sensor to generate usable image data. That is, if the Schmitt triggers of two pixels have different hysteresis characteristics (e.g., one has high/low trigger voltages of 3.1V and 1.9V, respectively and the other has high/low trigger voltages of 2.9V and 1.1V), then the two pixels would undesirably generate different image data values (i.e., different reset count numbers) when subjected to the same received light intensity. Unfortunately, the comparators and differential amplifiers utilized by conventional Schmitt triggers to achieve accurate and uniform hysteresis characteristics require significantly large amounts of chip area, and typically utilize bias voltages to maintain uniform hysteresis characteristics that consume DC current, and thus DC power, at all times during operation. The resulting large size and power consumption of self-reset circuits that utilize conventional Schmitt triggers enhanced with a comparator or differential amplifier becomes unacceptable when, as in advanced image and radiation sensors circuits, hundreds of thousands or millions of such counters (pixels) are required on a single chip. As such, the comparators or differential amplifiers required by conventional Schmitt triggers to achieve sufficiently accurate and uniform hysteresis present an obstacle to developing advanced sensor IC devices with higher density pixels and/or larger pixel counts.

What is needed is a Schmitt trigger circuit that overcomes the above-mentioned deficiencies associated with conventional Schmitt trigger circuits. In particular, what is needed is a small Schmitt trigger circuit that achieves accurate and uniform hysteresis without requiring the use of large comparator or differential amplifier circuits, and without the need for a DC bias voltage. Even more particularly, what is needed is a small, reliable, low-power-consumption Schmitt trigger circuit that can be produced with minimal changes to an existing semiconductor (e.g., CMOS) process flow that has been developed for fabricating advanced sensor and other IC circuits.

SUMMARY OF THE INVENTION

The present invention is generally directed to Schmitt trigger circuits having hysteresis characteristics determined by the on/off states of two MOSFETs having substantially identical source/drain/channel configurations (i.e., the same size and compositions), but having two different polysilicon gate dopants that cause the two MOSFETs to turn on at two different (i.e., lower and higher) threshold voltages. In an exemplary embodiment, the two MOSFETs are implemented using two n-channel transistors having substantially identical n-type source/drain configurations (i.e., the same size and compositions) and identical polysilicon gate sizes, but the polysilicon gate structure of the first (standard) n-channel transistor is fabricated using a standard n-type dopant that causes the standard n-channel transistor to turn on at a relatively low (lower) threshold voltage (e.g., 1V), and the polysilicon gate structure of the second (non-standard) n-channel transistor is fabricated using a different, non-standard dopant (e.g., a p-type dopant, or a different n-type dopant or n-type doping concentration) that causes the non-standard n-channel transistor to turn on at a distinctly higher (e.g., more than 0.5V higher, or more than 50% higher) threshold voltage (e.g., 2V) than the lower threshold voltage. The Schmitt trigger circuit is configured such that an analog input signal is applied to the gate terminals of the two n-channel transistors, also includes an output control (e.g., a feedback/amplifier) circuit configured to generate a digital output signal whose output high/low state switches in accordance with the on/off states of the two n-channel transistors such that the hysteresis characteristics (i.e., the high/low trigger switching voltages) of the Schmitt trigger circuit are determined by the lower and higher threshold voltages of the standard and non-standard n-channel transistors. Several benefits arise from controlling the hysteresis of the Schmitt trigger circuit using two different (higher and lower) threshold voltages of two substantially identical MOSFETs having two different polysilicon gate dopants. First, this arrangement allows each Schmitt trigger circuit formed in accordance with the present invention to have a smaller areal size/footprint (i.e., take up less semiconductor chip area) than conventional Schmitt trigger circuits by way of achieving highly accurate hysteresis without the need for a comparator or differential amplifier circuit, as required by conventional Schmitt triggers in order to achieve comparable accuracy. Second, because the hysteresis characteristics (i.e., the high/low switching voltages) of each Schmitt trigger circuit are based on lower and higher threshold voltages determined by the work function difference between two gate dopants, the present invention facilitates fabricating multiple Schmitt trigger circuits on a single IC device, where all of the Schmitt trigger circuits exhibit accurate and uniform hysteresis characteristics. Moreover, because multiple Schmitt trigger circuits fabricated in different regions on the semiconductor chip of an IC device exhibit accurate and uniform hysteresis characteristics based on the work function difference between two gate dopants, the present invention avoids the need for a bias DC voltage, thereby providing Schmitt trigger circuits exhibiting reduced power consumption in comparison to conventional Schmitt triggers. Accordingly, the present invention provides a small, low-power-consumption Schmitt trigger circuit that overcomes the deficiencies of conventional Schmitt trigger circuits, and is particularly useful for advanced image sensors and other pixel-based IC devices that require accurate and uniform hysteresis performance from a large number of Schmitt trigger circuits.

According to a presently preferred embodiment, the non-standard polysilicon gate dopant utilized to fabricate the non-standard MOSFET transistor comprises a standard dopant utilized in an already established (standard) CMOS fabrication flow. In an exemplary embodiment, a Schmitt trigger circuit includes the two (standard and non-standard) n-channel transistors mentioned above, and also includes a standard p-channel transistor having a p-type polysilicon gate dopant that is applied during a standard p-type polysilicon doping process of an established CMOS fabrication flow. According to the presently preferred embodiment as applied to this example, the non-standard polysilicon gate dopant utilized to fabricate the non-standard n-channel transistor comprises the p-type polysilicon gate dopant utilized to fabricate the standard p-channel transistor. Specifically, after patterning the un-doped polysilicon gate structures associated with the n-channel and p-channel transistors, a first mask is patterned to facilitate n-type doping of the standard n-channel transistor gate structure (i.e., the first mask covers the non-standard n-channel and p-channel gate structures), and then a second mask is patterned to facilitate p-type doping of the non-standard and p-channel transistor gate structures (i.e., the second mask cover the standard n-channel transistor gate structure). Accordingly, the polycrystalline silicon gate structure of the non-standard n-channel transistor and the polycrystalline silicon gate structure of the standard p-channel transistor comprise a common (identical or substantially identical) p-type dopant material and associated doping concentration. An additional beneficial advantage of the preferred embodiment is that utilizing the already existing p-type polysilicon doping process minimizes changes to the established CMOS process flow (i.e., only modified mask patterns are required), thereby facilitating implementation of the present invention with minimal change to manufacturing costs and production yields.

According to an exemplary embodiment of the present invention, the output control (feedback/amplifier) circuit is configured to switch (change) the digital output signal generated on the Schmitt trigger circuit's output node only when the two (standard and non-standard) MOSFETs are both turned on (or both turned off) and subsequently both turned off (or both turned on). For example, using the standard and non-standard n-channel transistors mentioned above, the digital output signal changes from a first output value (i.e., "0" or "1") to a second output value ("1" or "0") only when the analog input signal rises from a voltage level at or below the lower threshold voltage of the standard n-channel transistor to a voltage level at or above the higher threshold voltage of the non-standard n-channel transistor. Note that the rising input voltage generates a first off-on switching pattern in which the standard n-channel transistor and the non-standard n-channel transistor switch from off (non-conducting) to on (conducting) in sequence. Specifically, both standard and non-standard n-channel transistors are turned off when the analog input signal is below the lower threshold voltage, only the standard n-channel transistor is turned on when the analog input signal rises from a voltage level below the lower threshold voltage to a voltage level between the lower and higher threshold voltages, and then both the standard and non-standard n-channel transistors are turned on when the analog input signal subsequently rises above the higher threshold voltage. Conversely, the digital output signal changes from the second output value (i.e., "1" or "0") back to the first output value ("0" or "1") only when the analog input signal falls from a voltage level at or above the higher threshold voltage to a voltage level at or below the lower threshold voltage, whereby the two transistors switch from on to off in sequence (i.e., with the non-standard n-channel transistor switching from on to off when the analog input signal initially falls from above the higher threshold voltage to between the higher and lower threshold voltages, and then the standard n-channel transistor switches from on to off when the analog input signal subsequently falls below the lower threshold voltage). This on-off switching approach is easily implemented using a small, simple output control (feedback/amplifier) circuit (e.g., consisting entirely of two standard inverters and two control transistors), which further facilitates forming Schmitt trigger circuits in accordance with the present invention that are small in size.

According to exemplary practical embodiments, small, low-power-consumption Schmitt trigger circuits are produced using two (standard and non-standard) n-channel transistors of the type described above, at least one pull-up p-channel transistor, and a simplified feedback/amplifier (output control) circuit entirely made up of two output inverters and two control transistors, with the two output inverters connected in series between an internal node and the Schmitt trigger output node, and with the two control transistors respectively coupled between an output terminal of at least one of the two output inverters and the drain the standard and non-standard n-channel transistors. In one specific embodiment, the two control transistors include a (third) n-channel transistor controlled by one of the two output inverters, thereby selectively coupling the drain terminal of the standard n-channel transistor to the first internal node, and a (fourth) n-channel transistor controlled by the other of the two output inverters, thereby selectively coupling the drain terminal of the non-standard n-channel transistor to the first internal node. This arrangement facilitates generating controlling the digital output signal according to the on-off pattern of the standard and non-standard n-channel transistors described above. In a second specific embodiment, the two control transistors include a (third) n-channel transistor and a (second) p-channel transistor controlled by the second output inverter, thereby selectively coupling either the drain terminal of the standard n-channel transistor or the drain terminal of the non-standard n-channel transistor to the first internal node in accordance with the digital output signal. In a third specific embodiment, the two control transistors include a (second) p-channel transistor and a (third) n-channel transistor controlled by the first output inverter, thereby selectively coupling either the drain terminal of the standard n-channel transistor or the drain terminal of the non-standard n-channel transistor to the first internal node in a manner similar to the second embodiment.

According to some exemplary practical embodiments, a Schmitt trigger circuit includes two input inverter circuits and an output circuit, where standard and non-standard MOSFETs described above are utilized to configure the input inverter circuits to respectively switch at different (high and low) inverter switching threshold (midpoint) voltages, and the output circuit is configured such that the Schmitt trigger circuit's hysteresis characteristics (i.e., high and low trigger voltage values) are determined by the different (high and low) inverter switching threshold voltages. Similar to conventional CMOS inverters, each input inverter includes a pull-up p-channel transistor and a pull-down n-channel transistor connected in series between a low (first) voltage source (e.g., ground or 0V) and a high (second) voltage source (e.g., a system voltage of 3.3V), where the gate terminals of the p-channel and n-channel transistors are connected to the inverter input terminal, and the inverter output terminal is connected to the signal path between the p-channel and n-channel transistors. At least one of the two inverters differs from a conventional inverter by way of using a non-standard MOSFET. For example, when a Schmitt trigger circuit comprises a standard (first) input inverter and a non-standard (second) input inverter, where the non-standard input inverter includes a standard p-channel transistor and the non-standard n-channel transistor described above, the resulting non-standard input inverter's switching threshold (midpoint) voltage is shifted to a higher voltage level (i.e., in comparison to a conventional inverter) due to the higher threshold voltage of the non-standard n-channel transistor. In alternative embodiments, the other input inverter is either implemented using a normal/conventional inverter circuit, whereby a difference between the two input inverter's switching threshold voltages is relatively small, or implemented using a non-standard p-channel pull-up transistor having a gate structure doped with the same n-type dopant utilized in the inverter's standard n-channel pull-down transistor. By forming the other inverter a non-standard p-channel pull-up transistor such that the other inverter's switching threshold (midpoint) voltage is shifted to a lower voltage level (i.e., in comparison to a conventional inverter) due to the lower threshold voltage of the non-standard p-channel transistor, the difference between the two input inverter's switching threshold voltages is produced. Accordingly, similar to the earlier mentioned embodiment, the two input inverter approach provides small, easily implemented, low-power-consumption Schmitt trigger circuits, where the two input inverters exhibit two different switching threshold voltages.

According to another practical embodiment of the present invention, a basic self-reset circuit is formed by connecting a Schmitt trigger circuit of the type described above between the source terminal and gate terminal of a reset transistor with the drain terminal connected to a high voltage source. The Schmitt trigger circuit turns on the reset transistor each time the analog input voltage (i.e., at the source terminal) falls to (or below) the Schmitt trigger's lower switching voltage (e.g., due to an applied current drain), and then turns off the reset transistor when the analog input voltage subsequently rises to or above the Schmitt trigger's higher switching voltage. The basic self-reset circuit thus "self-resets" its analog input voltage between the lower switching voltage and the higher switching voltage in a saw-tooth pattern.

According to another exemplary integrated circuit embodiment, a highly space and power efficient analog counter circuit is provided that generates an analog output signal whose value (e.g., analog voltage level) is correlated to (e.g., decreases in proportion to) the number of received input pulses, wherein the novel self-reset circuit described above is connected to reset the analog output signal to the Schmitt trigger's higher switching voltage each time the analog output signal falls to the Schmitt trigger's lower switching voltage. Because the novel Schmitt trigger circuit inherently provides a precise voltage range between the higher and lower switching voltages, each unit analog counter circuit is easily calibrated using known techniques to reset after a predetermined number of input pulses are received, thereby facilitating the low cost production of highly accurate analog counter circuits. Further, two or more unit analog counter arrangements can be combined to implement a 2n bit analog counter, for example, by connecting a series of counter circuits together with corresponding self-reset circuits such that each Schmitt trigger's output signal serves both to reset a first counter circuit, and as the pulse input to reset a next sequential counter circuit.

In accordance with another exemplary integrated circuit embodiment, an advanced image sensor includes an array of pixels, where each pixel includes a self-reset circuit connected to the pixel's photodiode such that discharge from the photodiode generates a current drain that pulls down the analog input voltage, and such that the self-reset circuit resets the photodiode to the Schmitt trigger's higher threshold voltage each time the analog input voltage falls to the Schmitt trigger's lower threshold voltage. To facilitate high dynamic range operations, each pixel also includes a counter circuit connected to the Schmitt trigger's output node that counts the number of times the photodiode is reset by the self-reset circuit during a predefined exposure period. Because the novel Schmitt trigger circuit inherently provides a precise self-reset voltage range that is essentially identical in all of the pixels, the present invention facilitates the low cost production of highly accurate advanced (high dynamic range) image sensors. Further, because the novel Schmitt trigger circuit is smaller and consumes little or no DC power in comparison to conventional self-reset circuits, the self-reset circuit of the present invention facilitates fabricating advanced image sensor with higher fill factor and lower power consumption.

BRIEF DESCRIPTION OF THE DRAWINGS

These and other features, aspects and advantages of the present invention will become better understood with regard to the following description, appended claims, and accompanying drawings, where:

FIGS. 7(A), 7(B) and 7(C) are diagrams showing inverter circuits utilized by the Schmitt trigger circuits of FIGS. 6(A) and 6(B) according to associated specific embodiments of the present invention;

DETAILED DESCRIPTION OF THE DRAWINGS

The present invention relates to a novel Schmitt trigger circuit, and to various circuits that utilize the novel Schmitt trigger circuit. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). The terms "rise", "rises", "fall" and "falls" are utilized herein to describe the relationship between a changing (increasing or decreasing) voltage signal and a specified voltage level during circuit operation. For example, the phrase "rises to" refers to an increasing voltage signal having a voltage level that continuously increases from below a specified voltage level until it equals or exceeds the specified voltage level. For example, using 1V as the specified voltage level, a voltage signal that constantly increases from 0V to 2V rises to the specified voltage level when it equals (and then exceeds) the 1V voltage level. Conversely, the phrase "falls to" refers to a decreasing voltage signal that continuously decreases (reduces) from a relatively high voltage above a specified voltage level to or below the specified voltage level. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
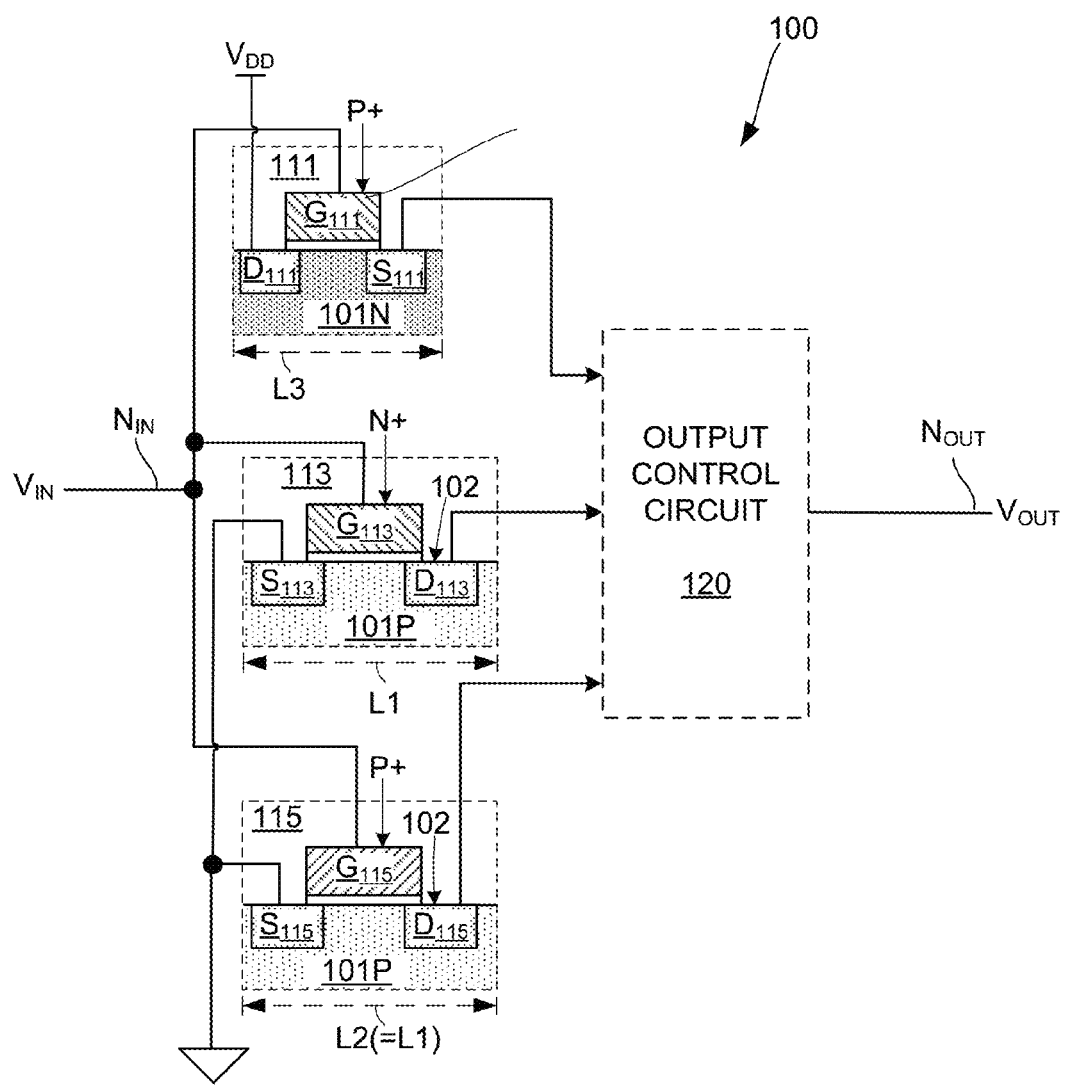
FIG. 1 is a simplified diagram showing a generalized Schmitt trigger circuit of the present invention.

FIG. 1 shows a generalized Schmitt trigger circuit 100 for generating a digital output signal $V_{OUT}$ at an output terminal (node) $N_{OUT}$ in response to an analog input signal $V_{IN}$ applied to an input terminal (node) $N_{IN}$ in accordance with an exemplary embodiment of the present invention. Schmitt trigger circuit 100 generally includes at least one pull-up p-channel transistor 111, and at least two pull-down n-channel transistors including a (first) n-channel transistor 113 and a (second) n-channel transistor 115, and an output control (e.g., amplifier/feedback) circuit 120.

Referring to the middle of FIG. 1, n-channel transistor 113 includes an N-doped source region $S_{113}$ and an N-doped drain region $D_{113}$ disposed in a P-doped substrate region 101P that are coupled between a first voltage source (e.g., ground GND) and output node $N_{OUT}$ (i.e., by way of output control circuit 120), and also includes a first polycrystalline silicon gate structure $G_{113}$ connected by way of a metal conductor to input node $N_{IN}$.

Referring to the lower portion of FIG. 1, n-channel transistor 115 includes an N-doped source region $S_{115}$ and an N-doped drain region $D_{115}$ that are disposed in P-doped substrate region 101P and coupled between the first voltage source and output node $N_{OUT}$, and includes a second polycrystalline silicon gate structure $G_{115}$ connected to input node $N_{IN}$.

According to an embodiment of the present invention, other than differences in their respective gate doping compositions (discussed below), n-channel transistors are otherwise essentially identical in size and composition (i.e., a length L1 of first n-channel transistor 113 is substantially identical to a length L2 of second n-channel transistor 115, source regions $S_{115}$ and $S_{115}$ and drain regions $D_{113}$ and $D_{115}$ comprise the same (common) n-type dopant material having the same dopant concentration, channel regions $C_{113}$ and $C_{115}$ are disposed in similar p-doped well regions 101P of a semiconductor (e.g., silicon) substrate, and polysilicon gate structures $G_{113}$ and $G_{115}$ have the same length and width dimensions).

Referring to the upper portion of FIG. 1, p-channel transistor 111 includes a P-doped source region $S_{111}$ and a P-doped drain region $D_{111}$ that are disposed in an N-doped substrate region 101N and coupled between a second voltage source (e.g., a system $V_{DD}$) and output node $N_{OUT}$, and includes a third polycrystalline silicon gate structure $G_{111}$ connected to input node $N_{IN}$. Note that an areal size (e.g., length L3) of p-channel transistor 111 is not necessarily the same size as that of n-channel transistors 113 and 115.

Referring to the right-side portion of FIG. 1, output control circuit 120 is coupled between Schmitt trigger output node $N_{OUT}$ and a source/drain terminal of each of standard n-channel transistor 113, non-standard n-channel transistor 115 and p-channel transistor 111. To facilitate functional operation of Schmitt trigger circuit 100 in a manner similar to that utilized by conventional Schmitt trigger circuits, output control circuit 120 is configured to change digital output signal $V_{OUT}$ between a first digital value (i.e., "0" (low voltage level) or "1" (high voltage level)) to a second value (i.e., "1" or "0") in accordance with the on/off states of transistors 111, 113 and 115 such that hysteresis characteristics (i.e., the high/low trigger switching voltages) of Schmitt trigger circuit 100 are at least partially determined by the threshold voltages of transistors 111, 113 and 115.

According to an aspect of the invention, the polysilicon gate structure of one of the two n-channel transistors 113 and 115 includes a non-standard gate dopant, whereby n-channel transistors 113 and 115 are intentionally fabricated to exhibit two distinctly different (lower and higher) threshold voltages. In an exemplary embodiment, n-channel transistor 113 is fabricated using standard CMOS fabrication techniques such that polycrystalline silicon gate structure $G_{113}$ includes an n-type dopant material (e.g., phosphorous or arsenic), whereby n-channel transistor 113 has a standard (e.g., relatively low, first) threshold voltage V1 (i.e., such that n-channel transistor 113 "turns on" to conduct current between source region $S_{113}$ and drain region $D_{113}$ when input voltage $V_{IN}$ is equal to or greater than relatively low voltage level V1 (e.g., 1V)). In contrast, n-channel transistor 115 is fabricated such that polycrystalline silicon gate structure $G_{115}$ is doped in a manner different from that of polycrystalline silicon gate structure $G_{113}$, and such that n-channel transistor 115 has a non-standard (second) threshold voltage V2 that is at least 0.5V or 50% higher than standard threshold voltage V1 of n-channel transistor 113. In a presently preferred embodiment, the non-standard NMOS fabrication technique utilized to provide n-channel transistor 115 with non-standard threshold voltage V2 involves doping polycrystalline silicon gate structure $G_{115}$ using the same p-type (second) dopant material (e.g., boron or indium) that is utilized to dope polycrystalline silicon gate structure $G_{111}$ of p-channel transistor 111 (i.e., such that polycrystalline silicon gate structure $G_{115}$ and polycrystalline silicon gate structure $G_{111}$ comprise a common/same p-type dopant material). A beneficial advantage of the preferred embodiment is that this approach produces a reliable and stable 1.05V hysteresis range while minimizing changes to standard CMOS process flows by utilizing the already existing polysilicon doping processes, thereby minimizing manufacturing costs and maximizing production yields. That is, the preferred embodiment may be implemented by modifying the corresponding process masks to facilitate doping of only polycrystalline silicon gate structure $G_{113}$ during an n-type polysilicon doping process (i.e., using a first mask configured to prevent n-type doping of polycrystalline silicon gate structures $G_{111}$ and $G_{115}$) and subsequently, during a p-type polycrystalline doping process of the standard CMOS process flow, simultaneously doping polycrystalline silicon gate structures $G_{111}$ and $G_{115}$ (i.e., using a second mask configured to preventing p-type doping of polycrystalline silicon gate structure $G_{113}$). N-channel transistor 115 and p-channel transistor 111 are thus produced with gate structures having common p-type dopant materials, and the two n-channel transistors 113 and 115 are thus produced with two distinctly different threshold voltages V1 (e.g., approximately 1V) and V2 (e.g., approximately 2V), respectively.

FIGS. 2(A) to 2(D) are simplified diagrams that explain the functional operation of output control circuit 120 in relation to the operating states of p-channel transistor 111 and n-channel transistors 113 and 115. As mentioned above, the operating states of p-channel transistor 111 and n-channel transistors 113 and 115 change in response to rising and falling analog input signals, and the operating state of each transistor is detected by output control circuit 120 by way of the associated connections to $V_{DD}$ and ground. As described below with reference to FIGS. 2(A) and 2(B), output control circuit 120 is configured such that digital output signal $V_{OUT}$ changes from the first voltage level/value (i.e., "0" or "1") to the second voltage level/value ("1" or "0") when analog input signal $V_{IN}$ decreases below the lower threshold (first voltage level) V1 of n-channel transistor 113, which causes both n-channel transistors 113 and 115 to turn off. As described below with reference to FIGS. 2(C) and 2(D), output control circuit 120 is further configured such that digital output signal $V_{OUT}$ changes from the second value ("1" or "0") to the first value ("0" or "1") when the analog input signal $V_{IN}$ increases above the higher threshold voltage V2 of n-channel transistor 115, which causes both n-channel transistors 113 and 115 to turn on. For exemplary purposes it is assumed that Schmitt trigger circuit has a non-inverting configuration, so digital output signal $V_{OUT}$ has a "0" value at the point depicted in FIG. 2(A) where analog input voltage $V_{IN}$ is below lower threshold voltage V1.

Figure 2A:
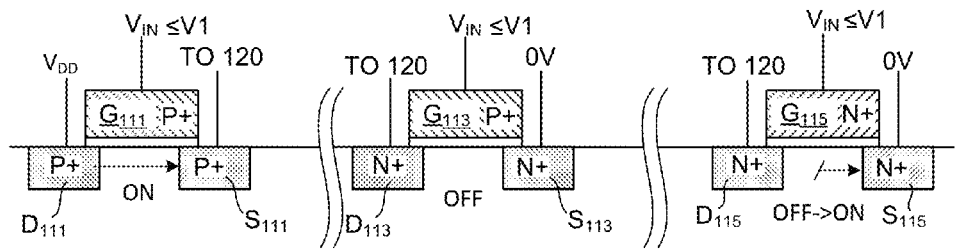
FIGS. 2(A), 2(B), 2(C) and 2(D) are simplified cross-sectional diagrams showing exemplary related on/off states of standard and non-standard MOSFETs during operation of the Schmitt trigger circuit of FIG. 1.

FIG. 2(A) illustrates an analog input voltage $V_{IN}$ that rises from a low voltage level (e.g., 0V) to lower threshold voltage V1. When input voltage $V_{IN}$ is below voltage V1 (i.e., the lower threshold voltage of n-channel transistor 115), both pull-down transistors 113 and 115 remain off and p-channel transistor 111 is turned on (i.e., current flows through the channel between drain region $D_{111}$ and source region $S_{111}$), whereby output control circuit 120 receives only a high $V_{DD}$ signal from p-channel transistor 111. When input voltage $V_{IN}$ rises to voltage V1, standard n-channel transistor 113 turns on (i.e., current flows through the channel between drain region $D_{113}$ and source region $S_{113}$), but non-standard n-channel transistor 115 remains turned off. Because output control circuit 120 detects that only one of n-channel transistors 113 and 115 is turned on (i.e., by way of only one connection to ground), output control circuit 120 maintains the digital output signal $V_{OUT}$ at its present "0" value.

Figure 2B:
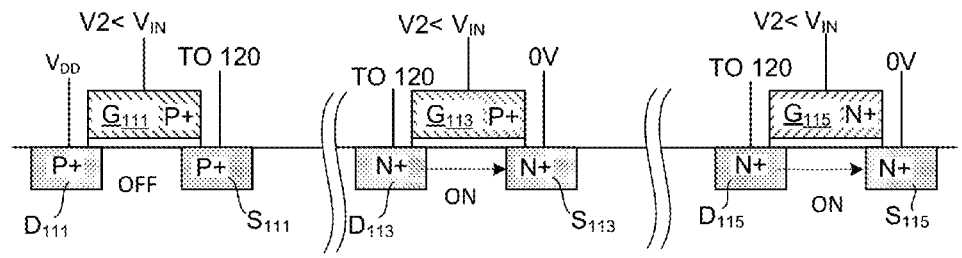

FIG. 2(B) illustrates analog input voltage $V_{IN}$ during a subsequent time when it rises from between threshold voltages V1 and V2 to a voltage level above higher threshold voltage V2. Note that standard n-channel transistor 113 is already on at this point. In the depicted embodiment, p-channel transistor 111 is turned off at this time, but in some embodiments may be constructed as a "weak" p-channel transistor that remains on at all times. When input voltage $V_{IN}$ becomes equal to higher threshold voltage V2, non-standard n-channel transistor 115 is also turned on (i.e., current flows through the channels between drain regions $D_{113}$ and $D_{115}$ to source regions $S_{113}$ and $S_{115}$, respectively). In this way, output control circuit 120 receives a pattern of low (0V) voltage levels that are determined by the on states of both n-channel transistors 113 and 115. In addition, output control circuit 120 is operably configured such that digital output signal $V_{OUT}$ changes between the first and second ("0" and "1") values when analog input signal $V_{IN}$ rises to a level high enough to turn on both n-channel transistors 113 and 115 (i.e., above higher threshold voltage V2, whereby output control circuit 120 is coupled to ground (0V) through both n-channel transistors 113 and 115).

Figure 2C:
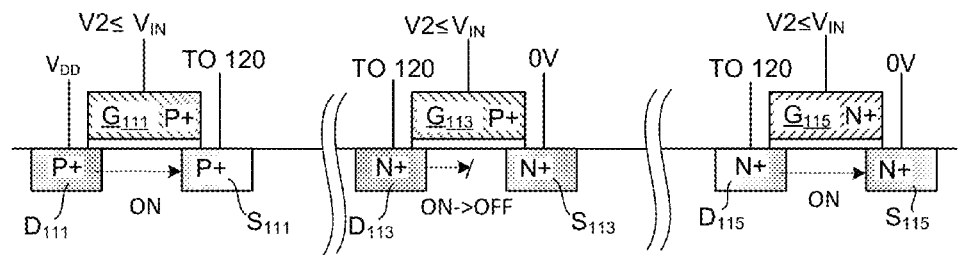

FIG. 2(C) illustrates the analog input voltage $V_{IN}$ during a subsequent fall from a high voltage level (e.g., 3V) to higher threshold voltage V2. While input voltage $V_{IN}$ is above higher threshold voltage V2, both pull-down transistors 113 and 115 remain turned on. When input voltage $V_{IN}$ falls to voltage V2, non-standard n-channel transistor 115 turns off (i.e., current is prevented from flowing through the channel between drain region $D_{115}$ and source region $S_{115}$), but standard n-channel transistor 113 remains turned on. Because output control circuit 120 detects that only one of n-channel transistors 113 and 115 is turned off (i.e., by way of only one connection to ground), output control circuit 120 maintains the digital output signal $V_{OUT}$ at its present "1" value.

Figure 2D:
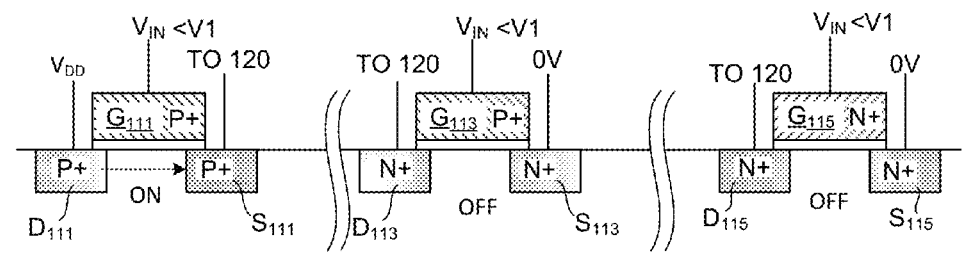

FIG. 2(D) illustrates analog input voltage $V_{IN}$ during a subsequent time when it falls from between threshold voltages V1 and V2 to a level below lower threshold voltage V1. When input voltage $V_{IN}$ becomes equal to lower threshold voltage V1, standard n-channel transistor 113 is also turned off and p-channel transistor 111 is turned on. In this way, output control circuit 120 receives a pattern of voltage levels (e.g., a connection to $V_{DD}$ by way of p-channel transistor 111) that is determined by the off states of both n-channel transistors 113 and 115. In accordance with the change from the both-turned-on to the both-turned-off state, output control circuit 120 changes digital output signal $V_{OUT}$ changes from the present "1" back to the "0" value. As set forth below, by forming Schmitt trigger circuit 100 such that it operates in the manner described above with reference to FIGS. 2(A) to 2(D), the present invention provides a small, low-power-consumption Schmitt trigger circuit that exhibits accurate and uniform hysteresis without requiring the use of comparators or differential amplifiers. Moreover, when produced using the preferred embodiment mentioned above, the present invention provides a solution to the problems set forth above that can be implemented using minimal changes to an existing semiconductor (e.g., CMOS) process flow.

According to an aspect of the present invention, the difference between the threshold voltages pull-down NMOS transistors 113 and 115 is determined by the bandgap ($E_g$) of the polysilicon gate structures, and as such is highly accurate and repeatable. That is, the threshold voltage of each pull-down NMOS transistor is determined according to the following Equations 1 and 2:

$$V_t = V_{FB} + 2\varphi_F - \frac{Q_s(2\varphi_F)}{C_{ox}} \qquad \text{Equation 1}$$

$$V_{FB} = \phi_{MS} - \frac{Q_{ss}}{C_{ox}} \qquad \text{Equation 2}$$

where $V_t$ is the threshold voltage, $V_{FB}$ is the flat band voltage, $\phi_F$ is the bulk potential, $Q_s$ is the electric charge in the silicon, $C_{ox}$ is the gate oxide capacitance, $Q_s$ is the gate oxide capacitance, $Q_{s_s}$ is the charge trapped in Si/Si-Oxide interface, and $\phi_{MS}$ is the work function difference between the gate and the silicon. As indicated, the difference between the threshold voltages of the two transistors is determined only in the flat band voltage due to the difference in the work function term $-\phi_{MS}$, as further set forth in Equations 3 and 4:

$$\phi_{MS} = \varphi_{F,poly} - \varphi_{F,bulk} \qquad \text{Equation 3}$$

$$\Delta V_t = \varphi_{F,poly}(p^+ - \text{poly}) - \varphi_{F,poly}(n^+ - \text{poly}) \approx \frac{1}{q}E_g \qquad \text{Equation 4}$$

Because Equation 4 shows that the difference $\Delta V_t$ between the two threshold voltages is determined only by the work function defined by the different (p+ and n+) dopant materials, the difference between the threshold voltages of pull-down NMOS transistors 113 and 115 is thus made highly accurate and has weak temperature dependence.

Figure 3:
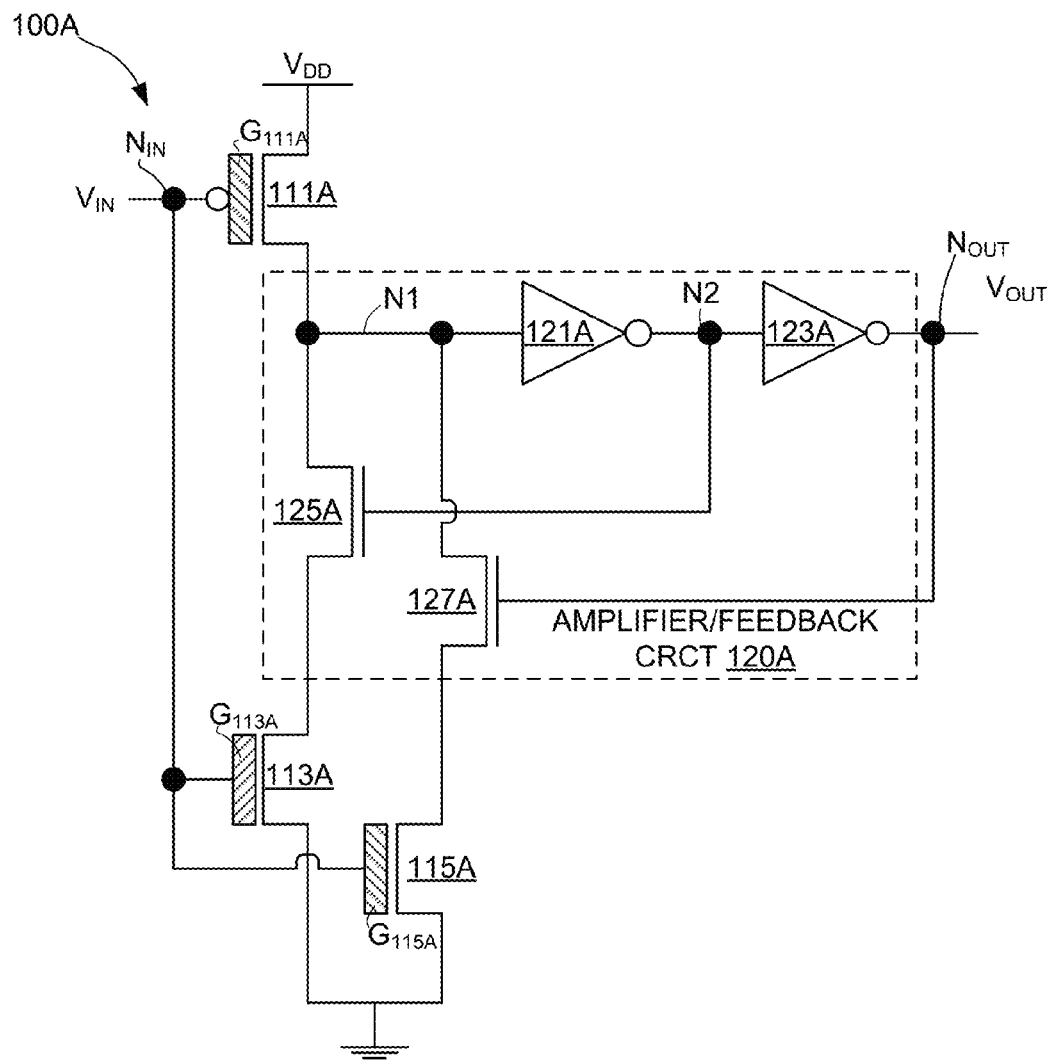
FIG. 3 is a circuit diagram showing a Schmitt trigger circuit according to an embodiment of the present invention.

FIG. 3 shows a Schmitt trigger circuit 100A in accordance with a first specific embodiment of the present invention. As in the generalized embodiment (FIG. 1), Schmitt trigger circuit 100A includes a pull-up p-channel transistor 111A, standard pull-down n-channel transistor 113A and a non-standard n-channel transistor 115A. Schmitt trigger circuit 100A also includes an amplifier/feedback (output control) circuit 120A coupled between these transistors and output node $N_{OUT}$ and configured such that Schmitt trigger circuit 100A functions as an inverting-type Schmitt trigger.

Referring to the left side of FIG. 3, p-channel transistor 111A and n-channel transistors 113A and 115A are controlled by an analog input signal $V_{IN}$ applied to input node $N_{IN}$, and are respectively coupled between two voltage sources and a first internal node N1 of amplifier/feedback circuit 120A. Specifically, p-channel transistor 111A is connected directly between system voltage source $V_{DD}$ and an internal node N1, and has a gate terminal $G_{111A}$ connected to input terminal $N_{IN}$. Standard n-channel transistor 113A is connected to ground and coupled to internal node N1 by way of a control transistor 125A, and has a gate terminal $G_{113A}$ connected to input terminal $N_{IN}$. Non-standard n-channel transistor 115A is connected to ground and coupled to internal node N1 by way of a second control transistor 127A, and has a gate terminal $G_{115A}$ connected to input terminal $N_{IN}$. As in the previous examples, gate $G_{115A}$ of non-standard n-channel transistor 115A is doped with a different (e.g., p-type dopant) than gate $G_{113A}$ of standard n-channel transistor 113A such that a higher threshold voltage V2 of non-standard n-channel transistor 115A is distinctly higher than a lower threshold voltage V1 of standard n-channel transistor 113A.

Amplifier/feedback (output control) circuit 120A includes two output inverters 121A and 123A and two control transistors 125A and 127A. Output inverters 121A and 123A are connected in series, with output inverter 121A connected between first internal node N1 a second internal node N2, and output inverter 123A connected between second internal node N2 and output terminal $N_{OUT}$. Control transistors 125A and 127A comprise standard (third and fourth) n-channel transistors that are connected in parallel between internal node N1 and n-channel transistors 113A and 115A, respectively, with the gate terminal of control transistor 125A connected to the output terminal of inverter 121A (i.e., to internal node N2), and the gate terminal of control transistor 127A connected to the output terminal of the second inverter 123A (i.e., to output terminal $N_{OUT}$).

FIGS. 4(A) to 4(E) show the operating state of the various transistors and inverters forming Schmitt trigger circuit 100A during operation, and FIGS. 5(A) to 5(E) are input/output curves indicating input/output voltages corresponding to the operating states shown in FIGS. 4(A) to 4(E), respectively. For purposes of simplifying the discussion, $V_{DD}$ is 3.3V, the threshold voltage of p-channel transistor 111A is −1V, the lower threshold voltage (V1) of standard n-channel transistor 113A is 1V, and the threshold voltage (V2) of non-standard n-channel transistor 115A is 2V, and p-channel transistor 111A remains "on" for input voltages between 0 and about 2.5V. Further, in a specific embodiment, control transistors 125A and 127A comprise n-channel transistors that are substantially identical to standard n-channel transistor transistor 113A.

Figure 4A:
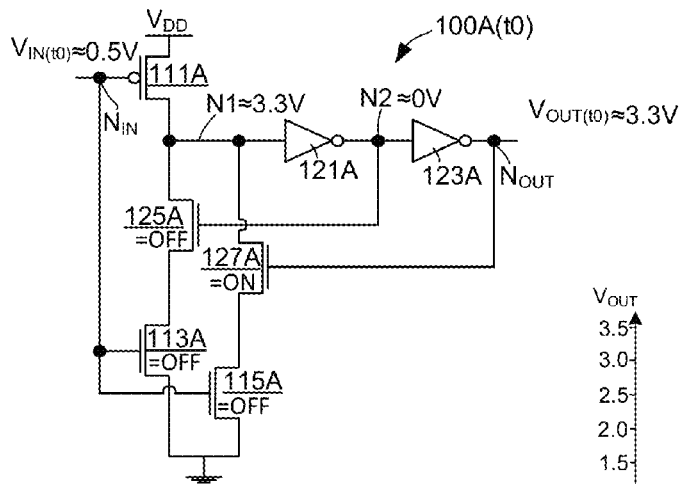
FIGS. 4(A), 4(B), 4(C), 4(D) and 4(E) show the Schmitt trigger circuit of FIG. 3 during operation.
Figure 5A:
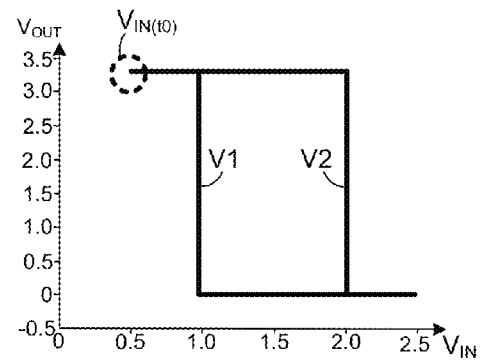
FIGS. 5(A), 5(B), 5(C), 5(D) and 5(E) are diagrams indicating input/output voltages of the Schmitt trigger circuit of FIG. 3 during operation.

FIGS. 4(A) and 5(A) show Schmitt trigger circuit 100A in a starting state at a time t0 (indicated as "100A(t0)" in FIG. 4(A)) during which an initial analog input voltage $V_{IN(t0)}$ equal to 0.5V is supplied to Schmitt trigger circuit 100A. As indicated in FIG. 4(A), analog input voltage $V_{IN(t0)}$ is applied to the gate terminals of p-channel transistor 111A and n-channel transistors 113A and 115A by way of input terminal $N_{IN}$. As indicated in FIG. 5(A), because voltage $V_{IN(t0)}$ is lower than both threshold voltages V1 and V2, both n-channel transistor's 113A and 115A remain turned off. However, because analog input voltage $V_{IN(t0)}$ is less than system voltage $V_{DD}$ minus the threshold voltage of p-channel transistor 111A (i.e., −1V), p-channel transistor 111A is turned on and generates a high (3.3V) voltage level at internal node N1. The high (3.3V) voltage level at internal node N1 causes inverter 121A to generate a low (0V) voltage at internal node N2, thereby turning off control NMOS 125A, and the low voltage level at internal node N2 causes inverter 123A to generate a high (3.3V) voltage at output terminal $N_{OUT}$, thereby turning on control NMOS 127A. Although control NMOS 127A is turned on, discharge from internal node N1 through control NMOS 127A is prevented by n-channel transistor 115A, which remains turned off, thereby maintaining initial output voltage $V_{OUT(t0)}$ at 3.3V.

Figure 4B:
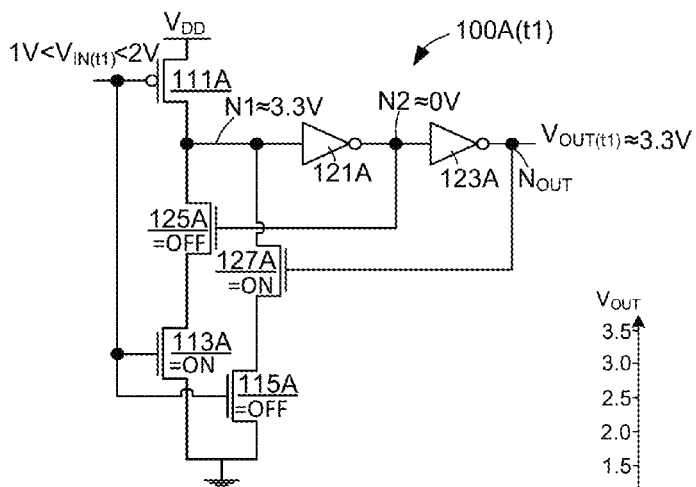
Figure 5B:
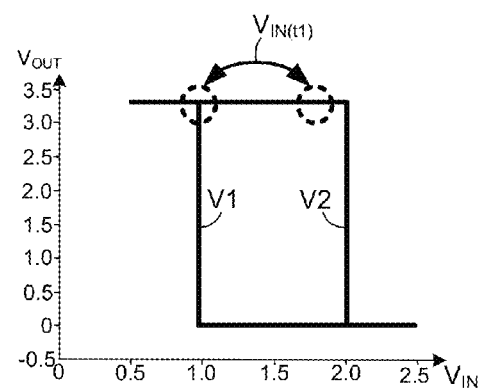

FIGS. 4(B) and 5(B) show Schmitt trigger circuit 100A (t1) at a subsequent time t1 during which analog input voltage $V_{IN(t1)}$ is maintained in a range greater than or equal to 1V but less than 2V. As indicated in FIG. 5(B), because voltage $V_{IN(t1)}$ is greater than threshold voltage V1 of n-channel transistor 113A, n-channel transistor 113A is turned on during this time. However, because voltage $V_{IN(t1)}$ is lower than threshold voltage V2, n-channel transistor 115A remains turned off. Note that the voltages at internal nodes N1 and N2 remain the same as in the starting state, with the high voltage level at internal node N1 causing inverter 121A to generate a low voltage at internal node N2, whereby control NMOS 125A remains turned off, and the low voltage level at internal node N2 causing inverter 123A to generate a high voltage at output terminal $N_{OUT}$, whereby control NMOS 127A remains turned on. Although at time t1 both control NMOS 127A and n-channel transistor 113A are turned on, discharge from internal node N1 through either path is prevented by control transistor 125A, which is turned off and thus prevents flow through n-channel transistor 113A, and by n-channel transistor 115A, which remains turned off and thus prevents flow through control NMOS 127A. Accordingly, output voltage $V_{OUT(t1)}$ is maintained at 3.3V during time t1.

Figure 4C:
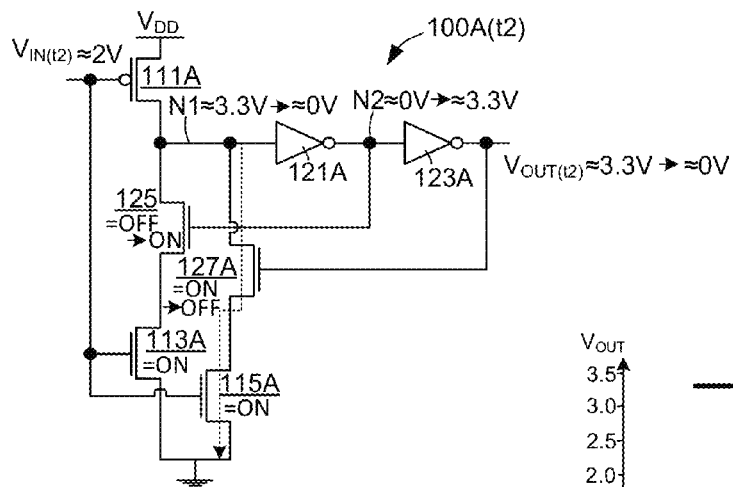
Figure 5C:
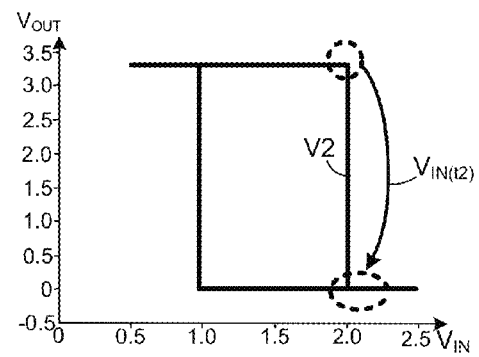

FIGS. 4(C) and 5(C) show Schmitt trigger circuit 100A (t2) at a subsequent time t2 when analog input voltage $V_{IN(t2)}$ rises above 2V. As indicated in FIG. 5(C), because voltage $V_{IN(t2)}$ is greater than both threshold voltages V1 and V2, output voltage $V_{OUT(t2)}$ changes from high to low. Specifically, as indicated by the dashed-line arrow in FIG. 4(C), because control transistor 127A is turned on at the first portion of time t2, a discharge path is formed between internal node N1 and ground when input voltage $V_{IN(t2)}$ rises above 2V and n-channel transistor 115A turns on. Of course, this discharge path causes the voltage level at node N1 to fall from 3.3V to 0V (as indicated), which in turn causes inverter 121A to change the voltage at node N2 from 0V to 3.3V, which causes inverter 123A to change output voltage $V_{OUT(t2)}$ from 3.3V to 0V. Note that the changing voltages at internal nodes N1 and N2 cause control transistors 125A and 127A to change states (i.e., control transistor 125A changes from "off" to "on" when inverter 121A changes the voltage level at node N2 to 3.3V, and an instant later control transistor 127A changes from "on" to "off" when inverter 123A changes output voltage $V_{OUT(t2)}$ to 0V). This change shuts off (open circuits) the discharge path though control transistor 127A and n-channel transistor 115A, but turns on (closed circuits) a discharge path through control transistor 125A and n-channel transistor 113A (indicated by the dash-lined arrow in FIG. 4(D)).

Figure 4D:
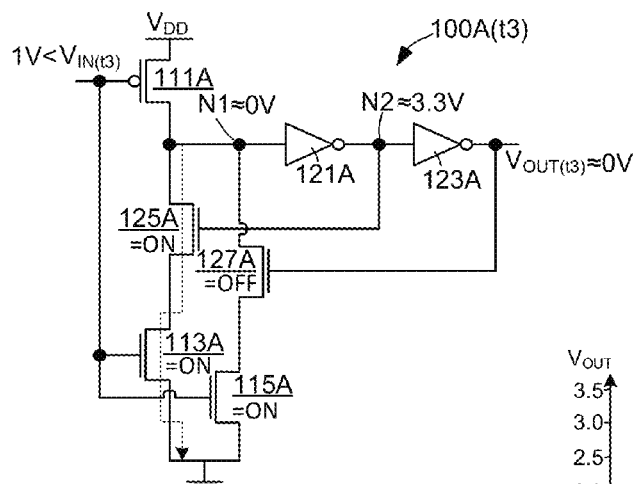
Figure 5D:
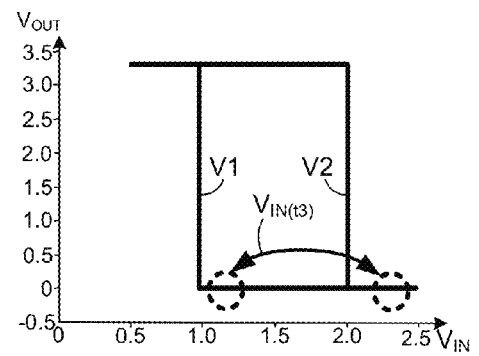

FIGS. 4(D) and 5(D) show Schmitt trigger circuit 100A (t3) at a time t3 subsequent to time t2 when analog input voltage $V_{IN(t3)}$ is maintained above 1V. As indicated in FIG. 5(D), because voltage $V_{IN(t3)}$ is greater than threshold voltage V1, output voltage $V_{OUT(t3)}$ remains low. Specifically, as indicated by the dashed-line arrow in FIG. 4(D), because control transistor 125A was turned on at the end of time t2, and because analog input voltage $V_{IN(t3)}$ is maintained above threshold voltage V1 of n-channel transistor 113A, the discharge path indicated in FIG. 4(D) remains turned on to maintains node N1 at 0V, which causes inverter 121A to maintain node N2 at 3.3V and control transistor 125A on, and which causes inverter 123A to maintain output voltage $V_{OUT(t2)}$ at 0V and control transistor 127A turned off.

Figure 4E:
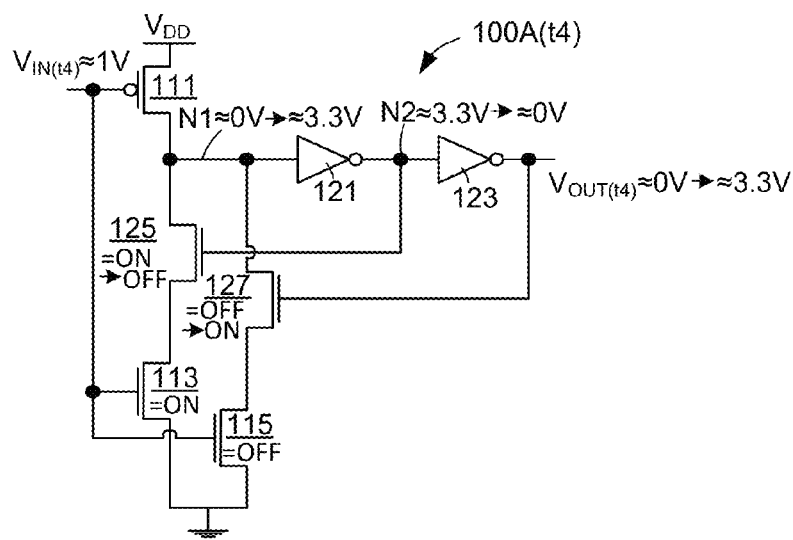
Figure 5E:
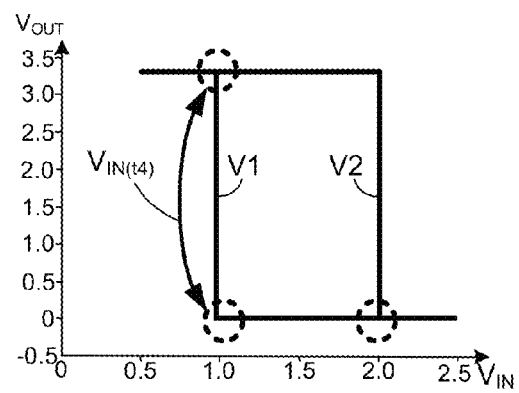

FIGS. 4(E) and 5(E) show Schmitt trigger circuit 100A (t4) at a subsequent time t3 when analog input voltage $V_{IN(t4)}$ falls to (or below) 1V. As indicated in FIG. 5(E), because voltage $V_{IN(t4)}$ is now less than both threshold voltages V1 and V2, output voltage $V_{OUT(t4)}$ changes from low to high. Specifically, as indicated in FIG. 4(E), because n-channel transistor 113A turns off when input voltage $V_{IN(t4)}$ falls to 1V, the discharge path through control transistor 125A and n-channel transistor 113A is shut off, thereby allowing p-channel transistor 111A to pull node N1 up to 3.3V, which inverter 121A to change the voltage at node N2 from 3.3V to 0V (turning off control transistor 125A), and causes inverter 123A to change output voltage $V_{OUT(t2)}$ from 0V to 3.3V (turning on control transistor 127A). Schmitt trigger circuit 100A(t4) is thus returned to the starting state described above with reference to FIGS. 4(A) and 5(A), and will remain in that "high output" state until the analog input voltage again rises above 2V (i.e., the threshold voltage of n-channel transistor 115A).

Figure 6A:
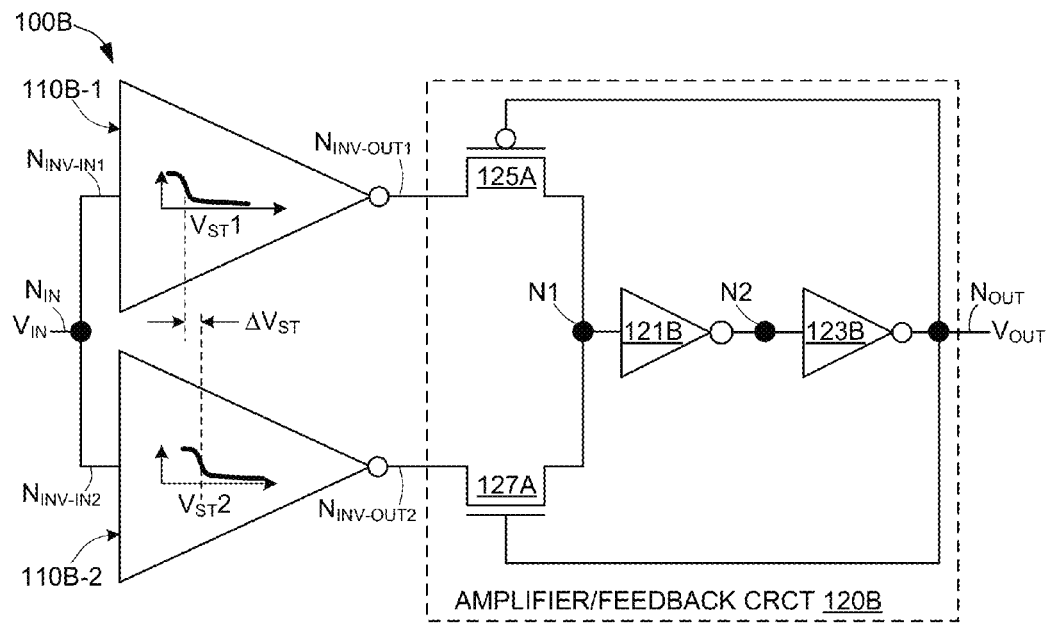
FIGS. 6(A) and 6(B) are simplified circuit diagrams respectively showing non-inverting and inverting Schmitt trigger circuits according to associated additional embodiments of the present invention.

FIG. 6(A) is a simplified circuit diagram showing a non-inverting Schmitt trigger circuit 100B according to a second specific embodiment of the present invention. Schmitt trigger circuit 100B is similar to Schmitt trigger circuit 100A (FIG. 3) in that it is generally configured to generate a digital output signal $V_{OUT}$ on output node $N_{OUT}$ in response to an analog input signal $V_{IN}$ applied to an input node $N_{IN}$ in a manner similar to a conventional non-inverting Schmitt trigger. In addition, similar to Schmitt trigger circuit 100A (discussed above), Schmitt trigger circuit 100B utilizes standard and non-standard MOSFETs having different (higher and lower) threshold voltages to at least partially control its hysteresis characteristics.

Schmitt trigger circuit 100B differs from Schmitt trigger circuit 100A in that, instead of being controlled mainly by the threshold voltages V1 and V2 of standard n-channel transistor 113A and non-standard n-channel transistor 115A, the hysteresis characteristics (i.e., the high/low trigger switching voltages) of Schmitt trigger 100B are defined by the inverter switching threshold characteristics of two input inverter circuits (inverters) 110B-1 and 110B-2, where input inverters 110B-1 and 110B-2 configured to switch inverter output states at two different (i.e., lower and higher) inverter switching threshold voltages. Specifically, (first) input inverter 110B-1 has a (first) input terminal $N_{INV-IN1}$ connected to input node $N_{IN}$, and is configured to generate an inverter output signal on a (first) inverter output terminal $N_{INV-OUT1}$ having a low voltage level when analog input signal is above a switching threshold (midpoint) voltage $V_{ST}1$ (as indicated by the simplified voltage transfer curve that is superimposed onto inverter 110B-1 in FIG. 6(A)), and having a high voltage level when analog input signal is below switching threshold (midpoint) voltage $V_{ST}1$. Similarly, (second) input inverter 110B-2 has a (second) input terminal $N_{INV-IN2}$ connected to input node $N_{IN}$, and is configured to generate an inverter output signal on a (second) inverter output terminal $N_{INV-OUT2}$ having a low value when analog input signal is above a switching threshold voltage $V_{ST}2$, and having a high voltage level when analog input signal is below switching threshold voltage $V_{ST}2$. As indicated in the intervening space in FIG. 6(A), input inverters 110B-1 and 110B-2 are configured such that switching threshold voltage $V_{ST}2$ is distinctly higher than switching threshold voltage $V_{ST}1$ (e.g., such that a difference $\Delta V_{ST}$ between switching threshold voltages $V_{ST}1$ and $V_{ST}2$ is at least 0.5V or 50%). According to alternative specific embodiments, the two different (lower and higher) switching threshold voltages $V_{ST}1$ and $V_{ST}2$ are established by configuring input inverters 110B-1 and 110B-2 using different combinations of standard and non-standard MOSFETs that cooperatively produce the desired inverter switching threshold difference $\Delta V_{ST}$.

According to a practical embodiment, both the n-channel transistors and p-channel transistors utilized to form input inverters 110B-1 and 110B-2 are fabricated using substantially identical size and sourced/drain/channel compositions, but differ in that the two n-channel transistor and the two p-channel transistors have different polycrystalline silicon gate dopants. In one embodiment, similar to n-channel transistors 113A and 115A of the first embodiment, the n-channel transistors respectively utilized by input inverters 110B-1 and 110B-2 have common size and sourced/drain/channel compositions, but one n-channel transistor has a standard n-type gate dopant and the other n-channel transistor has a different (e.g., p-type or other non-standard n-type) dopant that provides non-standard n-channel transistor with a higher threshold voltage than the standard n-channel transistor. Similarly, the two p-channel transistors respectively utilized by inverters 110B-1 and 110B-2 have common size and sourced/drain/channel compositions. As set forth below, in a presently preferred embodiment, the p-channel transistor utilized in input inverter 110B-2 is fabricated using a standard p-type gate dopant, but the other p-channel transistor utilized in input inverter 110B-1 is fabricated using a different (e.g., n-type or non-standard p-type) dopant that provides the non-standard transistor with a lower threshold voltage than standard p-channel transistor. With this arrangement, input inverter 110B-1 exhibits a lower inverter switching voltage than a normal inverter (i.e., an inverter formed using standard n-channel and p-channel transistors), whereby a difference between the lower and higher inverter switching voltages of input inverters 110B-1 and 110B-2 is provided.

Referring to the right side of FIG. 6(A), Schmitt trigger circuit 100B also includes an amplifier/feedback (output control) circuit 120B coupled between Schmitt trigger output node $N_{OUT}$ and inverter output terminals $N_{INV-OUT1}$ and $N_{INV-OUT2}$ of input inverters 110B-1 and 110B-2, respectively. Similar to circuit 120A of the first specific embodiment, amplifier/feedback circuit 120B includes two output inverters 121B and 123B and two control transistors 125B and 127B, but circuit 120B differs from circuit 120A in that it is in a non-inverting configuration. Output inverter 121B is connected between a first internal node N1 and a second internal node N2, and output inverter 123B is connected between second internal node N2 and Schmitt trigger output node $N_{OUT}$. Control transistors 125B and 127B respectively comprise a standard (third) p-channel transistor and a standard (third) n-channel transistor, with p-channel control transistor 125B connected between inverter output terminal $N_{INV-OUT1}$ and internal node N1, and with n-channel control transistor 127B connected between inverter output terminal $N_{INV-OUT2}$ and internal node N1. The gate terminals of control transistors 125B and 127B are connected to output terminal of inverter 123B (i.e., to output terminal $N_{OUT}$). With this non-inverting configuration, amplifier/feedback circuit 120B is configured to generate digital output signal $V_{OUT}$ at a low output value ("0") when the input voltage level of analog input signal $V_{IN}$ causes both input inverters 110B-1 and 110B-2 to simultaneously generate high output voltages on inverter output terminals $N_{INV-OUT1}$ and $N_{INV-OUT2}$, and configured to subsequently change digital output signal $V_{OUT}$ from the low output value ("0") to a high output value ("1") only when analog input signal $V_{IN}$ causes both input inverters 110B-1 and 110B-2 to simultaneously subsequently generate low output voltages on inverter output terminals $N_{INV-OUT1}$ and $N_{INV-OUT2}$.

Figure 6B:
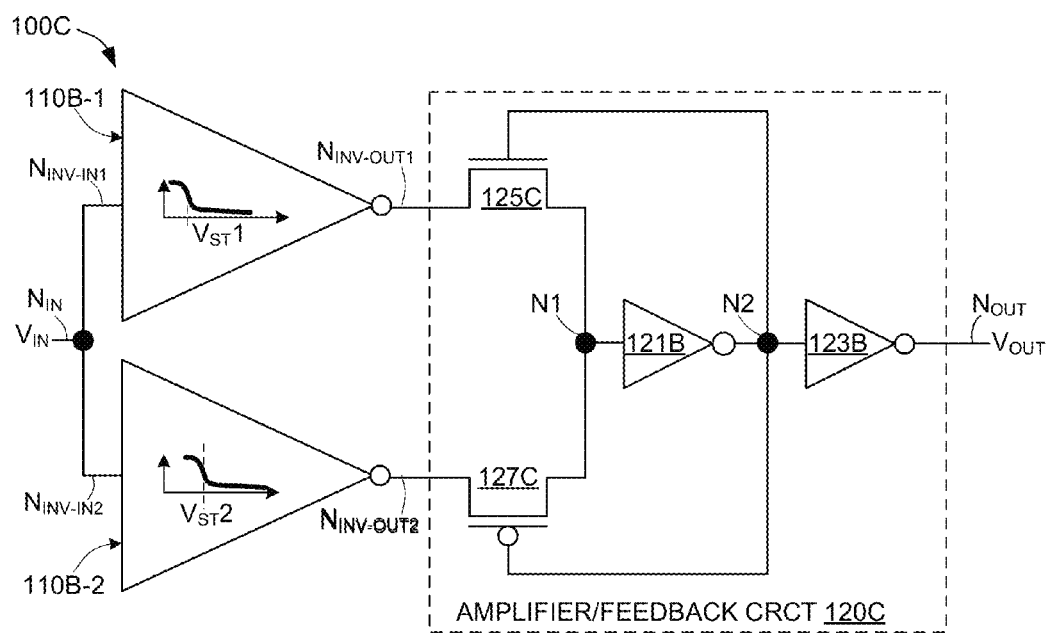

FIG. 6(B) an inverting-type Schmitt trigger circuit 100C according to a third specific embodiment of the present invention. Schmitt trigger circuit 100C utilizes the same input inverters 110B-1 and 110B-2 and output inverters 121B and 123B as those described above with reference to FIG. 6(A), and as such these elements will not be described in additional detail for brevity. Schmitt trigger circuit 100C differs from the embodiment of FIG. 6(A) in that the control transistors of amplifier/feedback circuit 120C are different, and the gate connection to the control transistors is different. Specifically, amplifier/feedback circuit 120C includes a control transistor 125C implemented by a (third) p-channel transistor connected between output terminal $N_{INV-OUT1}$ of input inverter 110B-1 and internal node N1, and a control transistor 127C implemented by a (third) n-channel transistor connected between output terminal $N_{INV-OUT2}$ of input inverter 110B-2 and internal node N1, and the control gates of control transistors 125C and 127C are connected to internal node N2. With this configuration, Schmitt trigger circuit 100C operates in an inverting manner similar to that described above with reference to Schmitt trigger circuit 100A.

Figure 8A:
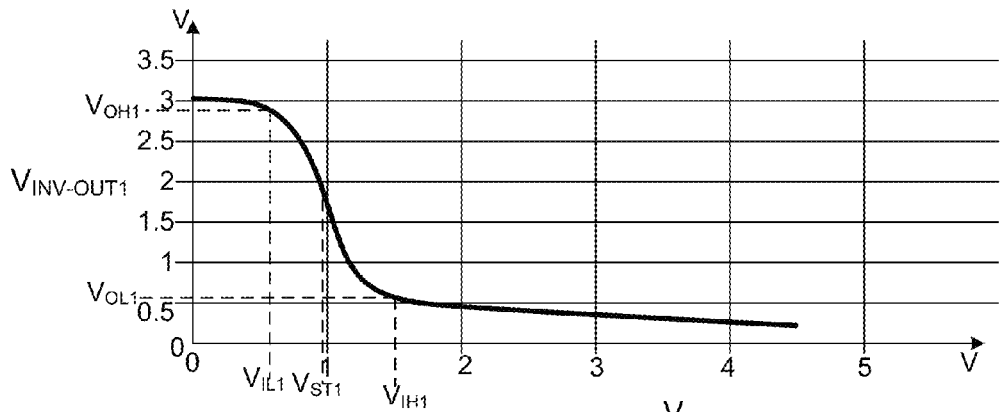
FIGS. 8(A), 8(B) and 8(C) are voltage transfer curves depicting operating characteristics of the inverter circuits of FIGS. 7(A), 7(B) and 7(C), respectively.
Figure 8B:
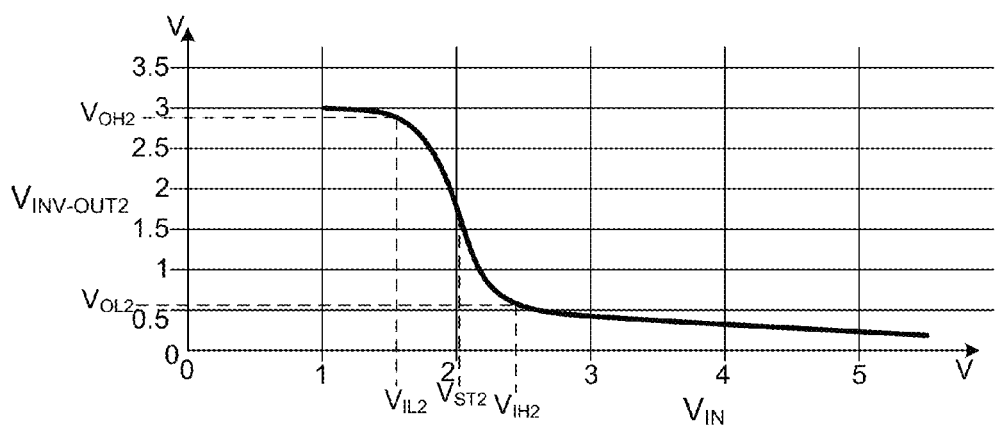
Figure 8C:
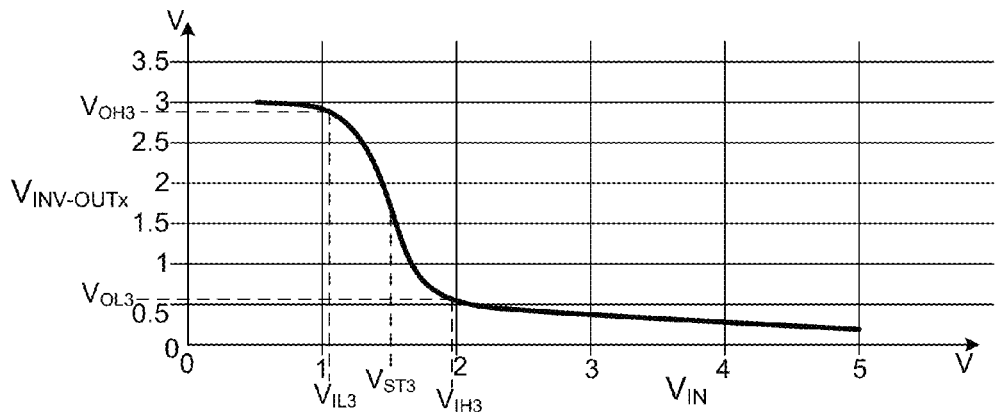

FIGS. 7(A), 7(B) and 7(C) depict three input inverters 110-1, 110-2 and 110-3 that may be utilized in the combinations mentioned below to implement input inverters 110B-1 and 110B-2 of Schmitt trigger circuits 100B and 100C, and FIGS. 8(A), 8(B) and 8(C) are voltage transfer curves respectively indicating exemplary operating characteristics input inverters 110-1, 110-2 and 110-3.

FIG. 7(A) shows inverter circuit 110-1, which in a presently preferred embodiment is utilized to implement inverter circuit 110B-1 of Schmitt trigger circuits 100B and 100C, and FIG. 8(A) is a voltage transfer curves depicting operating characteristics of inverter circuit 110-1. Inverter circuit 110-1 includes a non-standard p-channel transistor 111B-1 and a standard n-channel transistor 113B connected in series between system voltage source $V_{DD}$ and ground. A (first) inverter input terminal $N_{INV-IN1}$ is connected to trigger input node $N_{IN}$, and a (first) inverter output terminal $N_{INV-OUT1}$ is connected to a conductive path (wire) connecting n-channel transistor 113B and p-channel transistor 111B-1. In the presently preferred embodiment, both the polycrystalline silicon gate structure $G_{113}$ of n-channel transistor 113B and the polycrystalline silicon gate structure $G_{111-1}$ include substantially identical (common) n-type dopant materials and associated doping concentrations that are formed simultaneously during a standard n-type doping process. As such, n-channel transistor 113B and p-channel transistor 111B-1 are configured such that, as depicted in FIG. 8(A), input inverter 110-1 generates inverter output signal $V_{INV-OUT1}$ on inverter output terminal $N_{INV-OUT1}$ that rises to a high inverter output voltage value $V_{OH1}$ when analog input signal $V_{IN}$ is below switching threshold voltage $V_{ST}1$, and falls to a low inverter output voltage value $V_{OL1}$ when analog input signal $V_{IN}$ is above switching threshold voltage $V_{ST}1$. As indicated in FIG. 8(A), for purposes of brevity, switching threshold voltage $V_{ST}1$, which in the depicted embodiment occurs at approximately 1V, is defined as the midpoint voltage between the input high voltage $V_{IH1}$ and input low voltage $V_{IL1}$, where voltages $V_{IH1}$ and $V_{IL1}$ generally represent the threshold voltages of n-channel transistor 113B and p-channel transistor 111B-1, respectively.

FIG. 7(B) shows inverter circuit 110-2, which in a presently preferred embodiment is utilized to implement inverter circuit 110B-2 of Schmitt trigger circuits 100B and 100C, and FIG. 8(B) is a voltage transfer curves depicting operating characteristics of inverter circuit 110-1. Inverter circuit 110-2 includes a standard p-channel transistor 111B-2 and a non-standard n-channel transistor 115B connected in series between system voltage source $V_{DD}$ and ground, a (second) inverter input terminal $N_{INV-IN2}$ connected to trigger input node $N_{IN}$, and a (second) inverter output terminal $N_{INV-OUT2}$ connected between n-channel transistor 115B and p-channel transistor 111B-2. In the presently preferred embodiment, both the polycrystalline silicon gate structure $G_{115}$ of n-channel transistor 115B and the polycrystalline silicon gate structure $G_{111-2}$ include substantially identical (common) p-type dopant materials and associated doping concentrations that are formed simultaneously during a standard p-type doping process. As such, n-channel transistor 115B and p-channel transistor 111B-2 are configured such that, as depicted in FIG. 8(B), input inverter 110-2 generates inverter output signal $V_{INV-OUT2}$ on inverter output terminal $N_{INV-OUT2}$ that rises to a high inverter output voltage value $V_{OH2}$ when analog input signal $V_{IN}$ is below switching threshold voltage $V_{ST}2$, and falls to a low inverter output voltage value $V_{OL2}$ when analog input signal $V_{IN}$ is above switching threshold voltage $V_{ST}2$. As indicated in FIG. 8(B), for purposes of brevity, switching threshold voltage $V_{ST}2$, which in the depicted embodiment occurs at approximately 2V, is defined as the midpoint voltage between the input high voltage $V_{IH2}$ and input low voltage $V_{IL2}$, where voltages $V_{IH2}$ and $V_{IL2}$ generally represent the threshold voltages of n-channel transistor 115B and p-channel transistor 111B-2, respectively.

FIG. 7(C) depicts a third inverter 110-3 that includes a standard p-channel transistor 111-3 and a standard n-channel transistor 114 connected in series between system voltage source $V_{DD}$ and ground, an inverter input terminal $N_{INV-INx}$ connected to trigger input node $N_{IN}$, and a (second) inverter output terminal $N_{INV-OUTx}$ connected between n-channel transistor 114 and p-channel transistor 111-3. In this case, polycrystalline silicon gate structure $G_{114}$ of n-channel transistor 114 includes a standard n-type dopant material and the polycrystalline silicon gate structure $G_{111-3}$ of p-channel transistor 111-3 includes a standard p-type dopant material, whereby, as depicted in FIG. 8(C), input inverter 110-3 generates inverter output signal $V_{INV-OUT2}$ on inverter output terminal $N_{INV-OUTx}$ that rises to a high inverter output voltage value $V_{OH3}$ when analog input signal $V_{IN}$ is below switching threshold voltage $V_{ST}3$, and falls to a low inverter output voltage value $V_{OL3}$ when analog input signal $V_{IN}$ is above switching threshold voltage $V_{ST}3$. As indicated in FIG. 8(C), switching threshold voltage $V_{ST}3$ occurs at approximately 1.5V and is the midpoint voltage between the input high voltage $V_{IH3}$ and input low voltage $V_{IL3}$ that generally correspond to the threshold voltages of n-channel transistor 114 and p-channel transistor 111-3, respectively.

Referring again to FIGS. 6(A) and 6(B), as explained above Schmitt trigger circuits 100B and 100C are formed such that input inverter 110B-1 has a lower switching threshold voltage and input inverter 110B-2 has a higher switching threshold voltage. To reliably achieve the required switching threshold voltage difference, both input inverters 110B-1 and 110B-2 are fabricated using n-channel transistors having substantially identical source/drain/channel compositions and areal sizes (i.e., as described in the previous embodiments), and also using p-channel transistors having substantially identical source/drain/channel compositions and areal sizes, and the switching threshold voltage difference is achieved by forming input inverters 110B-1 and 110B-2 using at least one non-standard MOSFET of the type described above (i.e., having a non-standard polysilicon gate dopant), whereby the higher-than-normal (or lower-than-normal) threshold voltage of the at least one non-standard MOSFET facilitates the corresponding required higher/lower switching threshold voltage difference between input inverters 110B-1 and 110B-2. In a presently preferred embodiment, input inverters 110B-1 and 110B-2 are respectively implemented using inverters 110-1 and 110-2 shown in FIGS. 7(A) and 7(B), whereby the voltage difference between lower-than-normal switching threshold voltage $V_{ST}1$ and higher-than-normal switching threshold voltage $V_{ST}2$ provides a maximum range between the high/low switching voltages of Schmitt trigger circuits 100B and 100C (e.g., 1V). However, in some embodiments where a smaller (e.g., 0.5V) difference between the inverter switching threshold voltages is desired, one of input inverters 110B-1 and 110B-2 may be implemented using standard inverter circuit 110-3 of FIG. 7(C). For example, Schmitt trigger circuits 100B and 100C may be fabricated by implementing input inverter 110B-2 using inverter circuit 110-3 (i.e., with inverter 110B-1 implemented using inverter circuit 110-1 of FIG. 7(A)), or by implementing input inverter 110B-1 using inverter circuit 110-3 (i.e., with inverter 110B-2 implemented using inverter circuit 110-2 of FIG. 7(B)). In other possible embodiments, different gate dopants (e.g., non-standard n-type or p-type gate dopants) may be utilized to generate other inverter switching threshold voltage differences.

The novel Schmitt trigger circuits described above may be utilized to facilitate the production of a wide variety of novel low-power consumption IC devices, such as the exemplary IC devices discussed below with reference to FIGS. 9 to 11. That is, the novel Schmitt trigger circuits may be utilized to replace conventional Schmitt trigger circuits in various circuit structure types in order to benefit from the reduced power consumption characteristics of the novel Schmitt trigger circuits. As mentioned above, by utilizing the preferred embodiment in which the non-standard MOSFETs are formed using existing doping processes, the novel Schmitt trigger circuits may be utilized to replace conventional Schmitt trigger circuits in CMOS IC devices (e.g., self-reset circuit such as those described below with reference to FIG. 9, or analog counters such as those described below with reference to FIGS. 10(A) and 10(B)) with minimal change to the established CMOS process flow, thereby minimizing manufacturing cost changes and maximizing production yields. Moreover, due to the small size of the novel Schmitt trigger circuits, the present invention facilitate the development of advanced sensors (e.g., such as sensor 500 described below with reference to FIG. 11) and other IC devices that utilize a large number of Schmitt trigger circuits.

Figure 9:
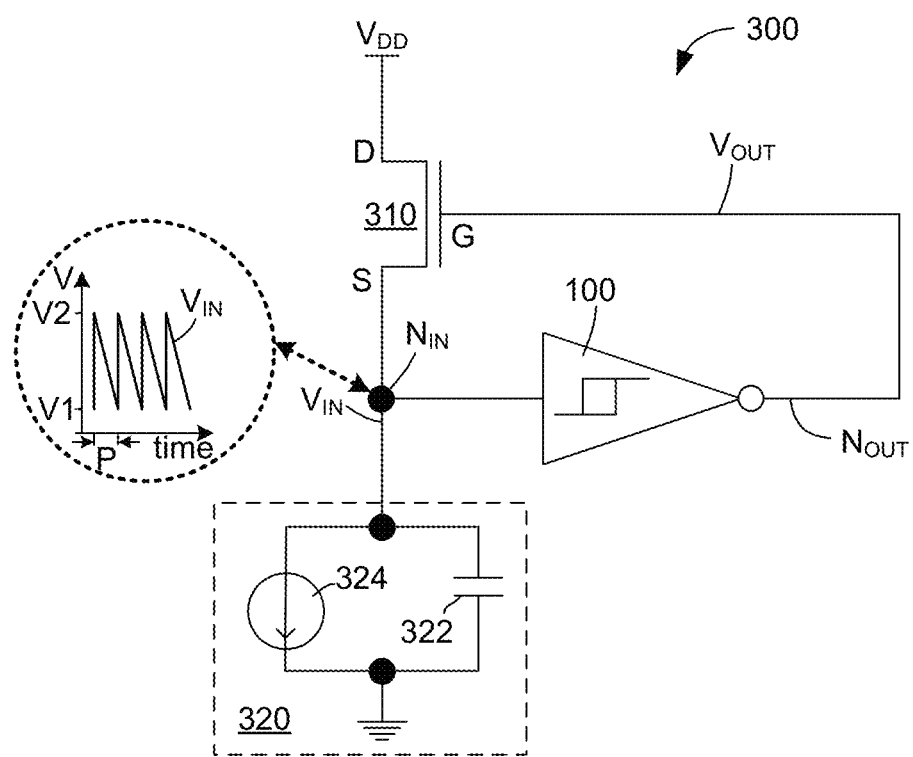
FIG. 9 is a simplified circuit diagram showing a self-reset circuit utilizing any of the Schmitt trigger circuits set forth above according to a generalized exemplary embodiment of the present invention.

FIG. 9 shows a generalized self-resetting (integrated) circuit 300 according to another embodiment of the present invention. Self-reset circuit 300 is formed by connecting Schmitt trigger circuit 100 (which may be implemented using any of the specific embodiments described above) between the source and gate terminals a reset NMOS transistor 310 (i.e., with the trigger input terminal $N_{IN}$ connected to the reset source terminal S and the trigger output terminal $N_{OUT}$ connected to the reset gate terminal G, and with the drain terminal D of reset NMOS 310 connected to system voltage source $V_{DD}$). For descriptive purposes, FIG. 9 also includes a generalized current drain circuit 320 represented by a capacitor 322 and a current source 324, where capacitor 322 is connected to receive and store analog voltage level $V_{IN}$ on input terminal $N_{IN}$, and current source 324 acts to gradually decrease analog voltage level $V_{IN}$ over time.

As indicated in the dash-lined bubble in the left side portion of FIG. 9, during operation self-reset circuit 300 generates analog input voltage $V_{IN}$ in a saw-tooth pattern that reliably and accurately ramps from higher threshold voltage V2 to lower threshold voltage V1 at a rate (period P) determined by the discharge current drawn through an applied load (e.g., current drain circuit 320). Specifically, each time analog input voltage $V_{IN}$ falls below the Schmitt trigger's lower threshold voltage V1 (e.g., 1V), Schmitt trigger circuit 100 generates a high output voltage $V_{OUT}$ (i.e., as described above with reference to FIGS. 4(C) and 5(C)) that momentarily turns on reset transistor 310, thereby coupling input terminal $N_{IN}$ to system voltage $V_{DD}$ through reset NMOS 310 and thus causing input terminal $N_{IN}$ to rise toward $V_{DD}$. Subsequently, as soon as analog input voltage $V_{IN}$ is "refreshed" (i.e., rises to higher threshold voltage V2, e.g., 2V), Schmitt trigger circuit 100 toggles to generate a low output voltage $V_{OUT}$ (i.e., as described above with reference to FIGS. 4(E) and 5(E)) that turns off reset transistor 310, thereby limiting the rise of analog input voltage $V_{IN}$ to higher threshold voltage V2. Schmitt trigger circuit 100 then maintains reset transistor 310 in the off state until an applied load (e.g., current drain circuit 320) discharges input terminal $N_{IN}$ to lower threshold voltage V1.

According to numerous additional embodiments, basic self-reset circuit 300 is utilized as a component that facilitates the low-cost production of larger integrated circuits requiring accurate, repeatable hysteresis. That is, because the two threshold voltages of the two pull-down NMOS transistors of each Schmitt trigger circuit 100 are determined by the work function difference set by the two different gate dopant materials, the hysteresis of all of the Schmitt trigger circuits (i.e., the difference between threshold voltages V2 and V1) is highly accurate and uniform. Accordingly, when multiple self-reset circuits 300 are fabricated simultaneously on a silicon "chip", with each self-reset circuit 300 including a novel Schmitt trigger circuit 100 in the manner described above, all of the resetting circuits 300 will have the same hysteresis and, hence, perform substantially identically to each other. As such, the present invention facilitates the low-cost fabrication of integrated circuits, such as the exemplary integrated circuits described below, that benefit from the accurate hysteresis, small size and low power consumption provided by the novel Schmitt trigger circuits described herein.

Figure 10A:
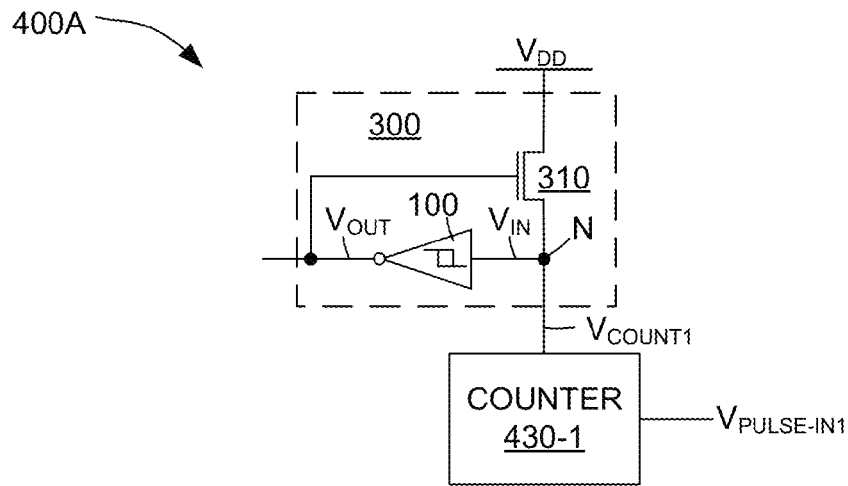
FIG. 10(A) is a simplified diagram showing a basic analog counter circuit unit utilizing the self-reset circuit of FIG. 9 according to another practical embodiment of the present invention.

FIG. 10(A) shows a unit analog counter circuit 400A, which represents an exemplary integrated circuit that is made highly space-efficient and power-efficient by way of implementing self-reset circuit 300 (described above with reference to FIG. 9). Unit analog counter circuit 400A includes a counter circuit 430 utilizes known circuit techniques to generate an analog output signal $V_{COUNT}$ on (reset) node N, thereby serving as analog input signal $V_{IN}$ to Schmitt trigger circuit 100, whose voltage level is inversely proportional to a number of analog pulses $V_{PULSE-IN}$ applied on the input terminal of counter circuit 430. That is, counter circuit 430 is constructed to operate such that the voltage level of analog output signal $V_{COUNT}$ incrementally reduces by a predetermined amount in response to each analog pulse $V_{PULSE-IN}$. By connecting counter circuit 430 as shown to self-reset circuit 300, voltage level of analog output signal $V_{COUNT}$ is initially set at the higher (second) threshold voltage level (e.g., voltage level V2 from FIG. 9) at the beginning of an operating cycle, and then incrementally falls to the lower (first) voltage level (e.g., voltage level V1 in the example above) after a predetermined number of analog pulses $V_{PULSE-IN}$, at which point self-reset circuit 300 resets analog output signal $V_{COUNT}$ to the higher threshold voltage level. Because novel Schmitt trigger circuit 100 inherently provides a precise voltage range (e.g., V2-V1) between the higher and lower threshold voltages, unit analog counter circuit 300 is easily calibrated using known techniques to reset after a set number of input pulses (e.g., ten pulses) are received, thereby facilitating the low cost production of highly accurate analog counter circuits.

Figure 10B:
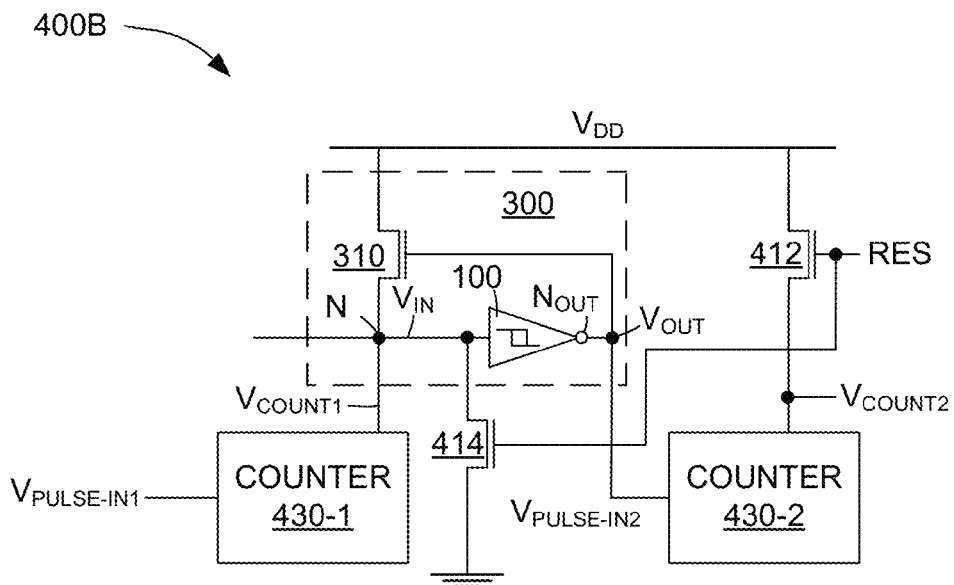
FIG. 10(B) is a simplified diagram showing a 2n bit analog counter circuit unit utilizing the self-reset circuit of FIG. 9 according to another practical embodiment of the present invention.

FIG. 10(B) shows a simplified 2n bit analog counter 400B that illustrates how unit analog counter circuit 400A (FIG. 10(A)) is expandable to provide large counting capacities. Analog counter 400B includes a first counter circuit 430-1 that is connected to self-reset circuit 300 in the manner described above such that a first analog output signal $V_{COUNT1}$ is generated in accordance with a number of received input pulses $V_{PULSE-IN1}$. In addition, analog counter 400B includes a second counter circuit 430-2 having an input terminal that is connected to output terminal $N_{OUT}$ of Schmitt trigger circuit 100 such that trigger output signal $V_{OUT}$ serves both to reset counter circuit 430-1 and to supply pulse input $V_{PULSE-IN2}$ to (next sequential) second counter circuit 430-2. First and second counter circuits 430-1 and 430-2 operate essentially identically as described above with reference to FIG. 10(A), whereby second counter circuit 430-2 generates a second analog output signal $V_{COUNT2}$ having a value that is correlated to a number of times analog output signal $V_{COUNT1}$ is reset (e.g., to higher threshold voltage level V2). An analog counter of any length is thus constructed by connecting a series of counter circuits together with corresponding self-reset circuits such that each Schmitt trigger's output signal serves both to reset one counter circuit and as the pulse input to a next sequential counter circuit.

Figure 11:
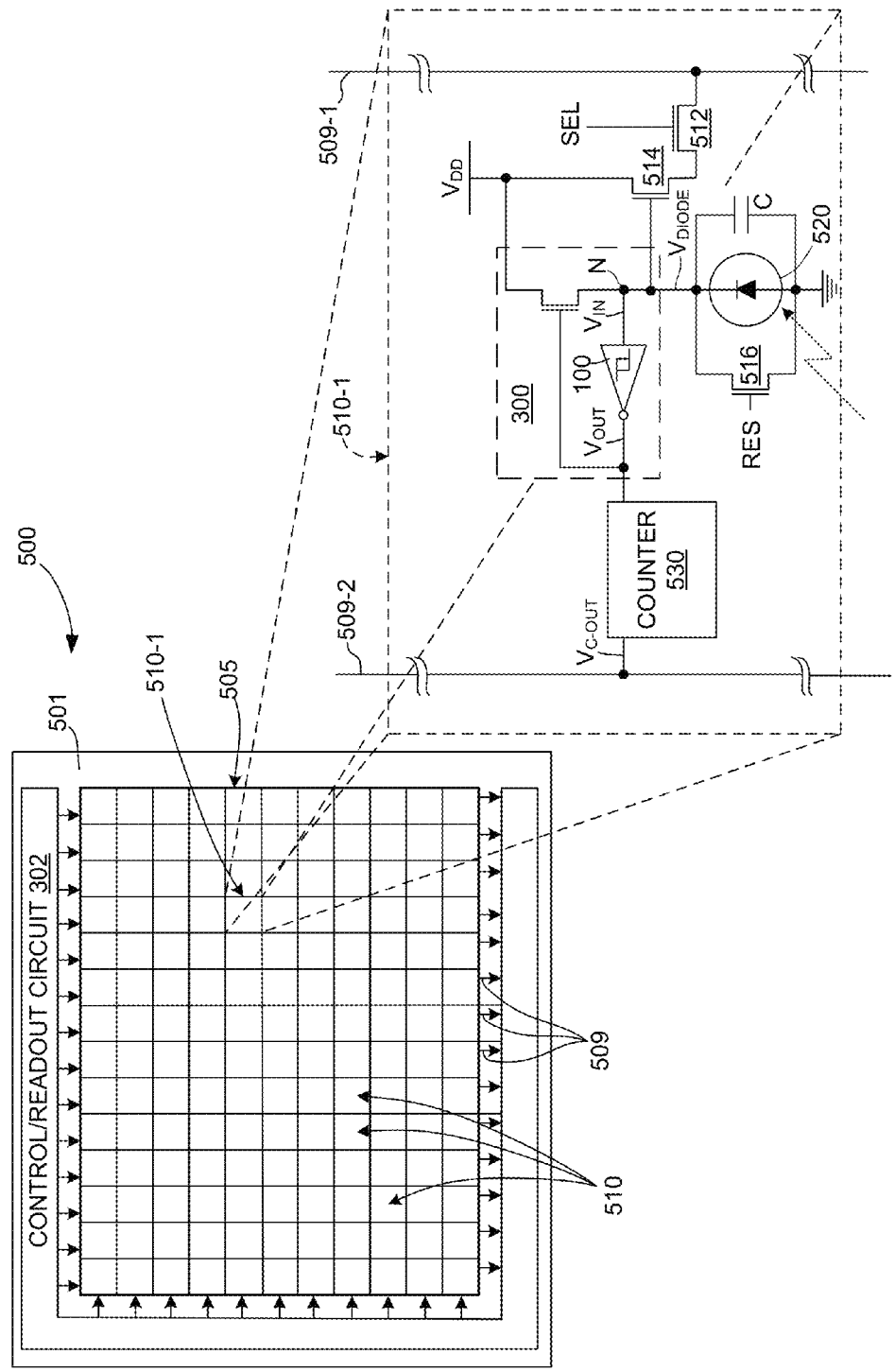
FIG. 11 is a simplified diagram showing an image sensor utilizing the self-reset circuit of FIG. 9 according to another practical embodiment of the present invention.

FIG. 11 shows an advanced "high dynamic range" image sensor 500, which represents another exemplary integrated circuit implementing self-reset circuit 300 (described above with reference to FIG. 9). Similar to conventional image sensors, image sensor 500 includes an array of pixels 510 fabricated on a silicon chip 501 and arranged in rows and columns that are addressed by control/readout circuitry 502 using known techniques. Also similar to conventional image sensors, each pixel 510 (e.g., pixel 510-1, which is shown in detail in the lower right portion of FIG. 11) includes a photodiode 520 and various transistors (e.g., select transistor 512, source-follower readout transistor 514 and reset transistor 516) that facilitate resetting and reading a diode voltage generated on photodiode 520 during operation. Image sensor 500 differs from conventional image sensors in that each pixel 510 includes an associated self-reset circuit 300 operably connected to a readout (reset) node N such that a photodiode voltage $V_{DIODE}$ stored on photodiode 520 is applied on input terminal $N_{IN}$ of Schmitt trigger circuit 100.

During operation, photodiode voltage $V_{DIODE}$ is reset to the higher threshold voltage level (e.g., voltage level V2 from FIG. 9) each time photodiode voltage $V_{DIODE}$ falls to or below the lower threshold voltage level (e.g., voltage level V1 in the example above). This arrangement forms a 3T pixel configuration with self-reset, where the integration time starts by switching reset transistor 516 (using reset signal RES) on and then off, which causes Schmidt trigger circuit 100 to initiate node N (i.e., photodiode voltage $V_{DIODE}$) to higher threshold voltage V2. The photocurrent of photodiode 520 then discharges the pixel's capacitance (which is stored on a capacitor C) such that photodiode voltage $V_{DIODE}$ is made proportional to the applied exposure, similar to any 3T pixel, and any remaining charge stored on readout (reset) node N is read out by way of source-follower transistor 514 using an associated bit line 509-1 (i.e., by turning on select transistor 512 using select control signal SEL).

As indicated to the left of Schmitt trigger 100, image sensor 300 achieves advanced "high dynamic range" operation by further including a counter circuit 530 having an input terminal connected to output terminal $N_{OUT}$ of Schmitt trigger circuit 100. Utilizing known circuit techniques, counter circuit 530 generates an output signal $V_{C-OUT}$ having a value (e.g., an analog voltage level, e.g., using the analog counter circuit described below, or a digital signal) that is correlated (i.e., directly or indirectly proportional) to a number of times photodiode voltage $V_{DIODE}$ is reset by Schmitt trigger circuit 100 to the higher threshold voltage level V2. That is, according to known high dynamic range operations, when the exposure (amount of light applied to photodiode 520 during a fixed exposure period) is large enough to cause photodiode voltage $V_{DIODE}$ to fall to or below lower threshold voltage V1 one or more times during the exposure period, Schmidt trigger inverter 100 functions as described above to reset photodiode voltage $V_{DIODE}$, and integration continues. At the end of the exposure period, the total exposure of pixel 510-1 is then determined by transmitting counter output signal $V_{C-OUT}$ onto bit line 509-2, which indicates the number of times photodiode voltage $V_{DIODE}$ was reset turning the exposure period, and by the residual photodiode charge read out by way of source-follower transistor 514 and select transistor 512.

Although the present invention has been described with respect to certain specific embodiments, it will be clear to those skilled in the art that the inventive features of the present invention are applicable to other embodiments as well, all of which are intended to fall within the scope of the present invention. For example, although Schmitt trigger 100A is illustrated as an inverting-type Schmitt trigger circuit, the spirit and scope of the present invention may be utilized to form a "normal" (non-inverting) Schmitt trigger circuit, e.g., by addition one or more additional inverters between the input and output terminals. Further, although the depicted embodiments exclusively utilize standard N-type and standard P-type gate dopant materials diffused into polysilicon gate structures to produce standard and non-standard MOSFETs, it is also possible to produce standard and non-standard MOSFETs that exhibit different (higher/lower) threshold voltages by doping the polysilicon gate structures using non-standard N-type and P-type dopant materials, or by fabricating the non-standard MOSFETs using different (i.e., not polysilicon) gate structure materials that are doped in the manner described above, although these alternative embodiments would typically require a more significant change to an established standard CMOS process flow (e.g., an additional mask and gate doping process to facilitate each non-standard N-type or p-type dopant).

The invention claimed is:

1. A Schmitt trigger circuit configured to generate a digital output signal on an output node in response to an analog input signal applied to an input node such that the digital output signal has a first output voltage level when an input voltage level of the analog input signal is above a higher threshold voltage, and such that the digital output signal has a second output voltage level when the input voltage level of the applied analog input signal is below a lower threshold voltage, the Schmitt trigger circuit comprising:

a first n-channel transistor coupled between a first voltage source and the output node and having a first polycrystalline silicon gate structure connected to the input node, wherein said first polycrystalline silicon gate structure comprises a first gate dopant such that said first n-channel transistor turns on only when said analog input signal is above said first threshold voltage;

a second n-channel transistor coupled between the first voltage source and the output node and having a second polycrystalline silicon gate structure connected to the input node, wherein said second polycrystalline silicon gate structure comprises a second gate dopant that is different from the first gate dopant such that said second n-channel transistor turns on only when said analog input signal is above a second threshold voltage, the second threshold voltage being higher than said first threshold voltage; and an output control circuit coupled between the output node and each of the first n-channel transistor and the second n-channel transistor, wherein the output control circuit is configured to generate the digital output signal according to on/off states of the first and second n-channel transistors, wherein the output control circuit is configured to change said digital output signal from a first output value to a second output value only when the input voltage level of the analog input signal rises from the second threshold voltage to the first threshold voltage, and configured to change said digital output signal from the second output value to the first output value only when the analog input signal falls from the first threshold voltage to the second threshold voltage.

2. The Schmitt trigger circuit according to claim 1,
wherein the first n-channel transistor includes a first source region and a first drain region disposed in a substrate, and the first polycrystalline silicon gate structure is disposed over a first channel region separating the first source and first drain regions,
wherein the second n-channel transistor includes a second source region and a second drain region disposed in the substrate, and the second polycrystalline silicon gate structure is disposed over a second channel region separating the second source and second drain regions,
wherein a size of the first n-channel transistor is substantially equal to a size of the second n-channel transistor, and
wherein the first and second source regions and the first and second drain regions comprise a common n-type dopant material.

3. The Schmitt trigger circuit of claim 1, further comprising a p-channel transistor coupled between a second voltage source and the output node, the p-channel transistor having a third polycrystalline silicon gate structure connected to the input node,
wherein both the second polycrystalline silicon gate structure and the third polycrystalline silicon gate structure comprise a common p-type dopant material.

4. A Schmitt trigger circuit configured to generate a digital output signal on an output node in response to an analog input signal applied to an input node such that the digital output signal has a first output voltage level when an input voltage level of the analog input signal is above a higher threshold voltage, and such that the digital output signal has a second output voltage level when the input voltage level of the applied analog input signal is below a lower threshold voltage, the Schmitt trigger circuit comprising:
a first n-channel transistor coupled between a first voltage source and the output node and having a first polycrystalline silicon gate structure connected to the input node, wherein said first polycrystalline silicon gate structure comprises a first gate dopant such that said first n-channel transistor turns on only when said analog input signal is above said first threshold voltage;
a second n-channel transistor coupled between the first voltage source and the output node and having a second polycrystalline silicon gate structure connected to the input node, wherein said second polycrystalline silicon gate structure comprises a second gate dopant that is different from the first gate dopant such that said second n-channel transistor turns on only when said analog input signal is above a second threshold voltage, the second threshold voltage being higher than said first threshold voltage; and
an output control circuit coupled between the output node and each of the first n-channel transistor and the second n-channel transistor, wherein the output control circuit is configured to generate the digital output signal according to on/off states of the first and second n-channel transistors;
a first p-channel transistor coupled between the second voltage source and a first internal node, and
wherein said output control circuit comprises:
a first output inverter connected between the first internal node and a second internal node;
a second output inverter connected between the second internal node and the output node;
a first control transistor connected between the first n-channel transistor and said first internal node; and
a second control transistor connected between the second n-channel transistor and said first internal node,
wherein a gate terminal of each of the first and second control transistors is connected to one of the second internal node and the output node.

5. The IC component of claim 4,
wherein the first control transistor comprises a third n-channel transistor having a gate terminal connected to the second internal node, and
wherein the second control transistor comprises a fourth n-channel transistor having a gate terminal connected to the output node.

6. The Schmitt trigger circuit of claim 4,
wherein the first control transistor comprises a third n-channel transistor having a gate terminal connected to the output node, and
wherein the second control transistor comprises a second p-channel transistor having a gate terminal connected to the output node.

7. The Schmitt trigger circuit of claim 4,
wherein the first control transistor comprises a second p-channel transistor having a gate terminal connected to the second internal node, and
wherein the second control transistor comprises a third n-channel transistor having a gate terminal connected to the second internal node.

8. The Schmitt trigger circuit of claim 4, further comprising:
a first input inverter including said first n-channel transistor and said first p-channel transistor; and
a second input inverter including said second n-channel transistor and a second p-channel transistor connected between the second voltage source and the output node, the second p-channel transistor having a fourth polycrystalline silicon gate structure connected to the input node;
wherein both the second polycrystalline silicon gate structure of the second n-channel transistor and the fourth polycrystalline silicon gate structure of the second p-channel transistor comprise a common p-type dopant material.

9. The Schmitt trigger circuit of claim 8, wherein both the first polycrystalline silicon gate structure of the first n-channel transistor and the third polycrystalline silicon gate structure of the first p-channel transistor comprise a common n-type dopant material.

10. The Schmitt trigger circuit of claim 9,
wherein the first control transistor comprises a third p-channel transistor connected between an output terminal of the first input inverter and the first internal node, and includes a gate terminal connected to the output node, and
wherein the second control transistor comprises a third n-channel transistor connected between an output terminal of the second input inverter and the first internal node, and includes a gate terminal connected to the output node.

11. The Schmitt trigger circuit of claim 9,
wherein the first control transistor comprises a third p-channel transistor connected between an output terminal of the first input inverter and the first internal node, and includes a gate terminal connected to the second internal node, and
wherein the second control transistor comprises a third n-channel transistor connected between an output terminal of the second input inverter and the first internal node, and includes a gate terminal connected to the second internal node.

12. A Schmitt trigger circuit configured to generate a digital output signal on an output node in response to an analog input signal applied to an input node, the Schmitt trigger circuit comprising:
a first input inverter including a first n-channel transistor and a first p-channel transistor connected in series between a first voltage source and a second voltage source, said first input inverter having a first input terminal connected to said input node and a first inverter output terminal connected between the first n-channel transistor and the first p-channel transistor;
a second input inverter including a second n-channel transistor and a second p-channel transistor connected in series between the first and second voltage sources, said second input inverter having a second inverter input terminal connected to said input node and a second inverter output terminal connected between the second n-channel transistor and the second p-channel transistor; and
an output control circuit coupled between the output node and said first and second output terminals of said first and second input inverters,
wherein said first n-channel transistor and said first p-channel transistor are configured such that said first input inverter generates a first high inverter output voltage on said first inverter output terminal when said analog input signal is below a first inverter switching voltage, and such that said first input inverter generates a first low inverter output voltage on said first inverter output terminal when said analog input signal is above the first inverter switching voltage,
wherein said second n-channel transistor and said second p-channel transistor are configured such that said second input inverter generates a second high inverter output voltage on said second inverter output terminal when said analog input signal is below a second inverter switching voltage, and such that said second input inverter generates a second low inverter output voltage on said second inverter output terminal when said analog input signal is above the second inverter switching voltage, said second inverter switching voltage being higher than said first inverter switching voltage, and
wherein the output control circuit is configured to change said digital output signal from a first output value to a second output value only when the input voltage level of the analog input signal causes said first and second input inverters to generate said first and second inverter high output voltages, and configured to change said digital output signal from the second output value to the first output value only when the analog input signal causes said first and second input inverters to generate said first and second inverter low output voltages.

13. The Schmitt trigger circuit according to claim 12, wherein the first n-channel transistor includes a first source region and a first drain region disposed in a substrate, and a first polycrystalline silicon gate structure disposed over a first channel region separating the first source and first drain regions,
wherein the second n-channel transistor includes a second source region and a second drain region disposed in the substrate, and a second polycrystalline silicon gate structure is disposed over a second channel region separating the second source and second drain regions,
wherein a size of the first n-channel transistor is substantially equal to a size of the second n-channel transistor,
wherein the first and second source regions and the first and second drain regions comprise a common n-type dopant material,
wherein said first polycrystalline silicon gate structure comprises a first gate dopant such that said first n-channel transistor turns on only when said analog input signal is above a first threshold voltage, and
wherein said second polycrystalline silicon gate structure comprises a second gate dopant that is different from the first gate dopant such that said second n-channel transistor turns on only when said analog input signal is above a second threshold voltage, the second threshold voltage being higher than said first threshold voltage.

14. The Schmitt trigger circuit of claim 13,
wherein the second p-channel transistor includes a third polycrystalline silicon gate structure connected to the input node,
wherein both the second polycrystalline silicon gate structure and the third polycrystalline silicon gate structure comprise a common p-type dopant material.

15. The Schmitt trigger circuit of claim 14,
wherein the first p-channel transistor includes a fourth polycrystalline silicon gate structure connected to the input node,
wherein both the first polycrystalline silicon gate structure and the fourth polycrystalline gate silicon gate structure comprise a common n-type dopant material.

16. The Schmitt trigger circuit of claim 14,
wherein said output control circuit comprises:
a first control transistor connected between the first inverter output terminal and the first internal node;
a second control transistor connected between the second inverter output terminal and said first internal node,
a first output inverter connected between the first internal node and a second internal node;
a second output inverter connected between the second internal node and the output node;
wherein a gate terminal of each of the first and second control transistors is connected to one of the second internal node and the output node.

17. The Schmitt trigger circuit of claim 16,
wherein the first control transistor comprises a third p-channel transistor having a gate terminal connected to the output node, and
wherein the second control transistor comprises a third n-channel transistor having a gate terminal connected to the output node.

18. The Schmitt trigger circuit of claim 16,
wherein the first control transistor comprises a third n-channel transistor having a gate terminal connected to the second internal node, and
wherein the second control transistor comprises a third p-channel transistor having a gate terminal connected to the second internal node.

19. An integrated circuit device including at least one self-reset circuit, said self-reset circuit including:
a reset transistor connected between a second voltage source and a reset node and having a gate terminal connected to an output node; and
a Schmitt trigger circuit configured to generate a digital output signal on the output node in response to an analog input signal applied to the reset node, wherein said Schmitt trigger circuit comprises:

a first n-channel transistor coupled between a first voltage source and the output node, the first n-channel transistor having a first polycrystalline silicon gate structure connected to the reset node;

a second n-channel transistor coupled between the first voltage source and the output node, the second n-channel transistor having a second polycrystalline silicon gate structure connected to the reset node;

a p-channel transistor coupled between the second voltage source and the output node, the p-channel transistor having a third polycrystalline silicon gate structure connected to the reset node; and an output control circuit coupled between the output node and each of the n-channel transistor and the p-channel transistor, wherein the first polycrystalline silicon gate structure comprises an n-type dopant material such that the first n-channel transistor turns on only when said analog input signal is above a first threshold voltage;

wherein both the second polycrystalline silicon gate structure and the third polycrystalline silicon gate structure comprise a common p-type dopant material such that said second n-channel transistor turns on only when said analog input signal is above a second threshold voltage, the second threshold voltage being higher than the first threshold voltage, wherein the output control circuit is configured to generate the digital output signal according to on/off states of the first n-channel transistor and the second n-channel transistors, and wherein the integrated circuit comprises an analog counter including an associated said self-reset circuit and a first counter circuit, said first counter circuit including means for generating a first analog output signal on said reset node such that said first analog output signal has a voltage level that is inversely proportional to a number of analog pulses applied to an input terminal of said counter circuit, whereby said analog output signal decreases to a after a predetermined number of analog pulses such that said self-reset circuit is caused to reset said analog output signal to said second voltage level.

20. The integrated circuit according to claim 19, wherein the analog counter further comprises a second counter circuit having an input terminal connected to the output terminal of the Schmitt trigger circuit, said second counter circuit including means for generating a second analog output signal having a value that is correlated to a number of times said first analog output signal is reset to said second voltage level.

21. An integrated circuit device including at least one self-reset circuit, said self-reset circuit including:

a reset transistor connected between a second voltage source and a reset node and having a gate terminal connected to an output node; and a Schmitt trigger circuit configured to generate a digital output signal on the output node in response to an analog input signal applied to the reset node, wherein said Schmitt trigger circuit comprises:

a first n-channel transistor coupled between a first voltage source and the output node, the first n-channel transistor having a first polycrystalline silicon gate structure connected to the reset node;

a second n-channel transistor coupled between the first voltage source and the output node, the second n-channel transistor having a second polycrystalline silicon gate structure connected to the reset node;

a p-channel transistor coupled between the second voltage source and the output node, the p-channel transistor having a third polycrystalline silicon gate structure connected to the reset node; and an output control circuit coupled between the output node and each of the n-channel transistor and the p-channel transistor, wherein the first polycrystalline silicon gate structure comprises an n-type dopant material such that the first n-channel transistor turns on only when said analog input signal is above a first threshold voltage;

wherein both the second polycrystalline silicon gate structure and the third polycrystalline silicon gate structure comprise a common p-type dopant material such that said second n-channel transistor turns on only when said analog input signal is above a second threshold voltage, the second threshold voltage being higher than the first threshold voltage, and wherein the output control circuit is configured to generate the digital output signal according to on/off states of the first n-channel transistor and the second n-channel transistors, wherein the integrated circuit comprises an image sensor including a plurality of pixels, each said pixel including an associated said self-reset circuit and a photodiode, wherein the photodiode is operably connected to the reset node such that a photodiode voltage stored on said photodiode is applied on the input terminal of said Schmitt trigger circuit, and such that said photodiode voltage is reset to said second voltage level each time said photodiode voltage falls to said first voltage level.

22. The integrate circuit according to claim 21, wherein each said pixel further comprises a counter circuit having an input terminal connected to the output terminal of said Schmitt trigger circuit, wherein said counter circuit includes means for generating an output signal having a value that is correlated to a number of times said photodiode voltage is reset to said second voltage level.

\* \* \* \* \*